US008575496B2

(12) United States Patent
Tanaka

(10) Patent No.: US 8,575,496 B2
(45) Date of Patent: Nov. 5, 2013

(54) MULTILAYER PRINTED WIRING BOARD AND METHOD OF MANUFACTURING THE SAME

(75) Inventor: Hironori Tanaka, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 0 days.

(21) Appl. No.: 13/269,079

(22) Filed: Oct. 7, 2011

(65) Prior Publication Data

US 2012/0037414 A1 Feb. 16, 2012

Related U.S. Application Data

(63) Continuation of application No. 12/216,747, filed on Jul. 10, 2008, now Pat. No. 8,115,113.

(60) Provisional application No. 60/991,465, filed on Nov. 30, 2007.

(51) Int. Cl.
*H05K 1/16* (2006.01)
*H05K 1/18* (2006.01)

(52) U.S. Cl.
USPC .......................... 174/260; 361/761; 361/762

(58) Field of Classification Search
USPC ................... 174/260, 264; 361/761–763
See application file for complete search history.

(56) References Cited

U.S. PATENT DOCUMENTS

| 6,512,182 B2 | 1/2003 | Takeuchi et al. ............ 174/262 |
| 6,617,669 B2 | 9/2003 | Saito ............................... 257/622 |
| 7,649,748 B2 | 1/2010 | Kariya et al. |
| 7,808,799 B2 | 10/2010 | Kawabe et al. ............ 174/256 |
| 7,817,440 B2 | 10/2010 | Kariya et al. |
| 7,855,894 B2 | 12/2010 | Inagaki et al. ............... 361/763 |
| 7,932,471 B2 * | 4/2011 | Yamamoto et al. ......... 174/260 |
| 2006/0012966 A1 | 1/2006 | Chakravorty ................. 361/763 |
| 2006/0243479 A1 | 11/2006 | Kim et al. .................... 174/256 |
| 2007/0125575 A1 | 6/2007 | Inui et al. .................... 174/262 |
| 2008/0100986 A1 | 5/2008 | Sohn et al. ................. 361/301.1 |
| 2008/0236877 A1 | 10/2008 | Amey et al. ................. 174/260 |
| 2009/0038835 A1 | 2/2009 | Tanaka et al. |

FOREIGN PATENT DOCUMENTS

| JP | 2001-332863 A | 11/2001 |
| JP | 2005-191559 | 7/2005 |
| JP | 2007-150002 A | 6/2007 |
| WO | WO 2006/134977 A1 | 12/2006 |
| WO | WO 2007/043683 A1 | 4/2007 |

\* cited by examiner

*Primary Examiner* — Zachary M Pape
(74) *Attorney, Agent, or Firm* — Oblon, Spivak, McClelland, Maier & Neustadt, L.L.P.

(57) ABSTRACT

A multilayer printed wiring board including a layered capacitor section provided on a first interlayer resin insulation layer and a high dielectric layer and first and second layered electrodes that sandwich the high dielectric layer. A second interlayer resin insulation layer is provided on the first insulation layer and the capacitor section, and a metal thin-film layer is provided over the capacitor section and on the second insulation layer. An outermost interlayer resin insulation layer is provided on the second insulation layer and the metal thin-film layer. A mounting section is provided on the outermost insulation layer and has first and second external terminals to mount a semiconductor element. Multiple via conductors penetrate each insulation layer. The via conductors include first via conductors that electrically connect the first layered electrode to the first external terminals. Second via conductors electrically connect the second layered electrode to the second external terminals.

2 Claims, 26 Drawing Sheets

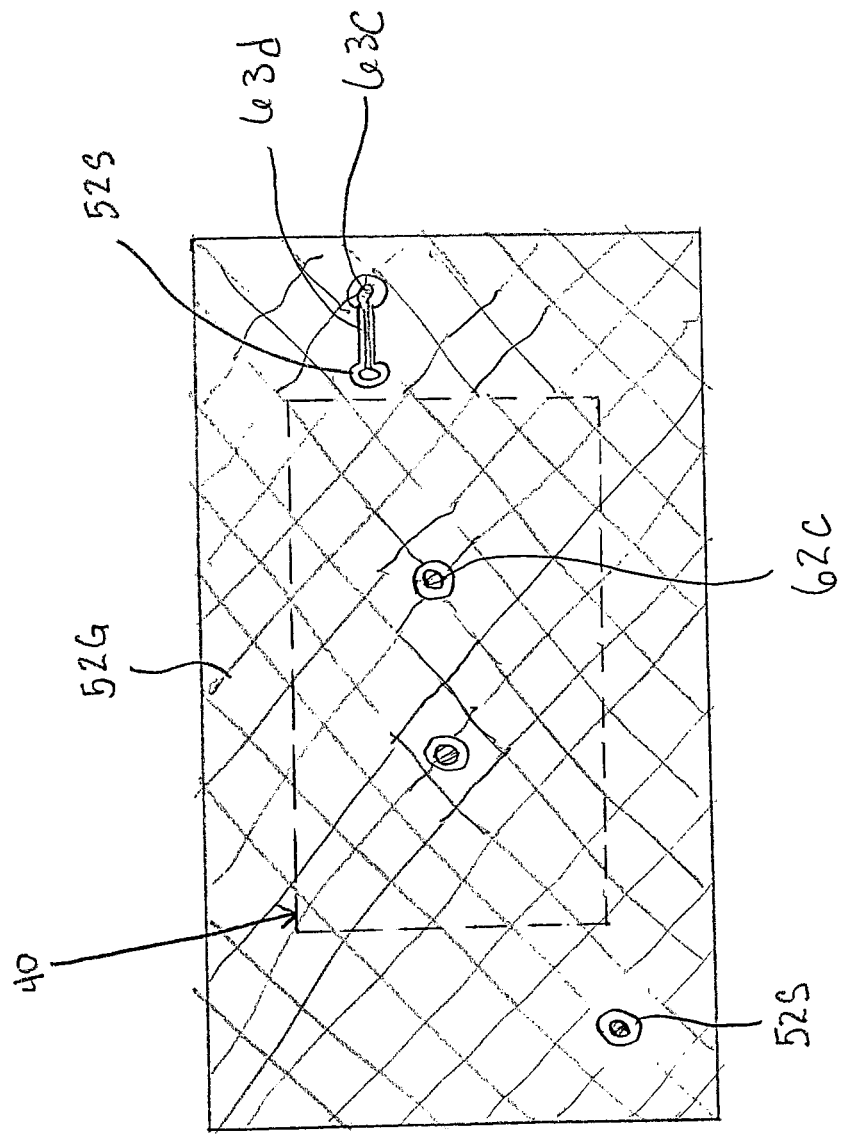

(a)

(b)

(a)

(b)

(c)

(a)

(b)

(a)

(b)

(a)

(b)

(a)

(b)

(a)

(b)

(a)

(b)

(a)

(b)

(a)

(b)

(a)

150

(b)

160
150

(c)

160a  160a  160a
160
150

(a)

(b)

(c)

(a)

(b)

(a)

(b)

(a)

(b)

(a)

(b)

(a)

(b)

(a)

(b)

(a)

(b)

(a)

(b)

MULTILAYER PRINTED WIRING BOARD AND METHOD OF MANUFACTURING THE SAME

RELATED APPLICATION

This application is a continuation and claims the benefit of priority from U.S. application Ser. No. 12/216,747, filed Jul. 10, 2008, which claims the benefit of U.S. Provisional Application Ser. No. 60/991,465, filed Nov. 30, 2007. The contents of each of these applications are incorporated herein by reference in their entirety.

TECHNICAL FIELD

The present invention relates to a multilayer printed wiring board or the like with a built-in capacitor, on which to mount, for example, a semiconductor element.

DESCRIPTION OF RELATED ART

Conventionally, numerous multilayer printed wiring boards, in which multiple wiring layers are laminated via insulation layers and a variety of electronic components such as a resistor or a semiconductor element are mounted on the surface, have been suggested. Also, in case of a sudden voltage drop of electric power (external electric power) supplied from an external source to the mounted semiconductor element, technology to supply steady electric power to the semiconductor element from a source other than the external power source is suggested.

As for technology publicly disclosed, for example, Japanese Laid-Open Patent Application 2005-191559 discloses a printed wiring board structured with: A mounting section to mount a semiconductor element on its surface; a layered capacitor section having a high dielectric layer made of ceramics, first and second layered electrodes sandwiching the high dielectric layer, where either the first or the second layered electrode is connected to the power-source line of the semiconductor element, and the other is connected to the ground line; multiple insulation layers; conductive circuits formed on the insulation layers; and via-hole conductors connecting multiple conductive circuits formed on separate insulation layers. The layered capacitor section is arranged between insulation layers. The entire content of 2005-191559 is incorporated herein by reference.

SUMMARY OF THE INVENTION

One aspect of the invention includes a multilayer printed wiring board including an insulation layer and a first interlayer resin insulation layer provided on the insulation layer. A layered capacitor section is provided on the first interlayer resin insulation layer and has a high dielectric layer and first and second layered electrodes that sandwich the high dielectric layer. Also included is a second interlayer resin insulation layer provided on the first interlayer resin insulation layer and the layered capacitor section, and a metal thin-film layer provided over the layered capacitor section and on the second interlayer resin insulation layer. An outermost interlayer resin insulation layer is provided on the second interlayer resin insulation layer and the metal thin-film layer, and a mounting section is provided on the outermost interlayer resin insulation layer and has first and second external terminals to mount a semiconductor element. Multiple via conductors penetrate each interlayer resin insulation layer. The via conductors include first via conductors that electrically connect the first layered electrode to the first external terminals, and second via conductors that electrically connect the second layered electrode to the second external terminals.

Another aspect of the invention includes a multilayer printed wiring board including a layered capacitor section having a high dielectric layer and first and second layered electrodes sandwiching the high dielectric layer, where either the first or the second layered electrode is connected to a power-source line and the other layered electrode, which is not connected to the power-source line, is connected to a ground line to store a predetermined amount of electric charge. A metal thin-film layer is provided over the layered capacitor section on an interlayer resin insulation layer, which maintains the same electrical potential as either the first or the second layered electrode of the layered capacitor section. A mounting section is provided over the metal thin-film layer on the interlayer resin insulation layer and is configured to mount on its surface a semiconductor element electrically connected to the layered capacitor section through via holes.

Still another aspect includes a method of manufacturing a multilayer printed wiring board including forming conductive circuits on an insulation layer and forming a first interlayer resin insulation layer on the insulation layer and the conductive circuits. Also included is laminating a layered capacitor section having a high dielectric layer and first and second layered electrodes that sandwich the high dielectric layer over the insulation layer on the first interlayer resin insulation layer. A second interlayer resin insulation layer is formed on the layered capacitor section and a metal thin-film layer is formed on the second interlayer resin insulation layer. An outermost interlayer resin insulation layer is formed on the second interlayer resin insulation layer and the metal thin-film layer, and external terminals are formed to mount a semiconductor element on the outermost interlayer resin insulation layer.

Incidentally, to supply steady electric power to a semiconductor element mounted on a multilayer printed wiring board, for example, the multilayer printed wiring board should be structured with an accumulator element such as a capacitor. In case of a sudden voltage drop of external electric power supplied to the semiconductor element, if supplemental voltage for the lowered external voltage is provided from the accumulator element, a steady supply of electric power may be achieved. Especially, it is desirable that the accumulator element be arranged near the mounted semiconductor element to provide supplemental electric power for the lowered external voltage, since a steady supply of electric power may be realized.

However, if ceramic material such as barium titanate or barium titanate strontium is used for the high dielectric layer of a capacitor and made into a thin film, such material may leak if extra voltage is applied under a high-temperature and high-humidity atmosphere. Accordingly, problems with tolerance to HAST factors may occur. In such a case, a leakage passage may be formed in the capacitor, causing current leakage, and may cause lowered reliability.

The objective of the present invention is to provide a multilayer printed wiring board or the like in which moisture absorption at the capacitor is suppressed and current leakage is reduced.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF EMBODIMENTS

According to the present invention, a multilayer printed wiring board or the like, in which moisture absorption at a layered capacitor section is suppressed and current leakage is reduced, may be provided. In the following, an embodiment to practice the present invention is described in detail.

Figure 1:
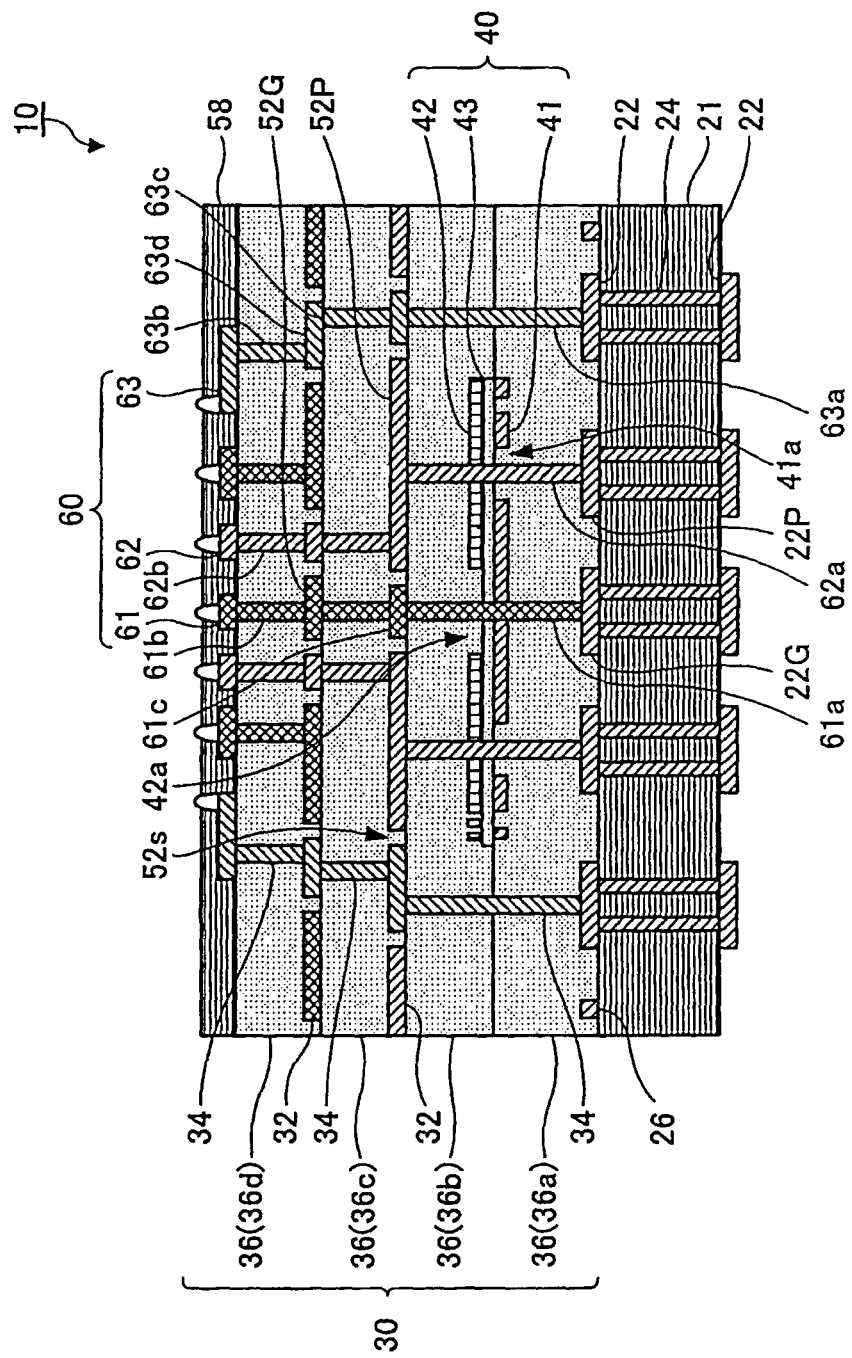
FIG. 1 is a view illustrating a longitudinal section of a multilayer printed wiring board according to an embodiment.

FIG. 1 is a view showing a longitudinal section of multilayer printed wiring board 10 according to an embodiment of the present invention. The view of FIG. 1 is taken approximately along the section line shown in FIG. 3. As shown in FIG. 1, multilayer printed wiring board 10 is structured with: Core substrate 21 as an example of an insulation layer having through-hole conductors 24; wiring patterns (conductive circuits) 22 formed on the top and bottom surfaces of core substrate 21; and built-up section 30 having wiring patterns (conductive circuits) 32 laminated multiple times over core substrate 21 via interlayer resin insulation layers 36, and via conductors 34 electrically connecting wiring patterns formed on separate interlayer resin insulation layers. Wiring patterns 22 formed on the top and bottom surfaces of core substrate 21 are electrically connected with each other via through-hole conductors 24 penetrating core substrate 21.

Core substrate (insulation layer) 21 is a resin substrate made of glass cloth or alamide non-woven fabric such as BT (bismaleimide-triazine) resin substrate or glass-epoxy substrate impregnated with thermoset resin and cured. The thickness is preferably in the range of 0.4 mm to 1.0 mm. Also, core substrate 21 may be a resin insulation layer made of inorganic filler and thermoset resin, or a resin insulation layer made of inorganic filler, thermoset resin and thermoplastic resin. Such resin insulation layers are preferred not to include glass cloth or glass fabric such as alamide non-woven fabric.

Figure 2:
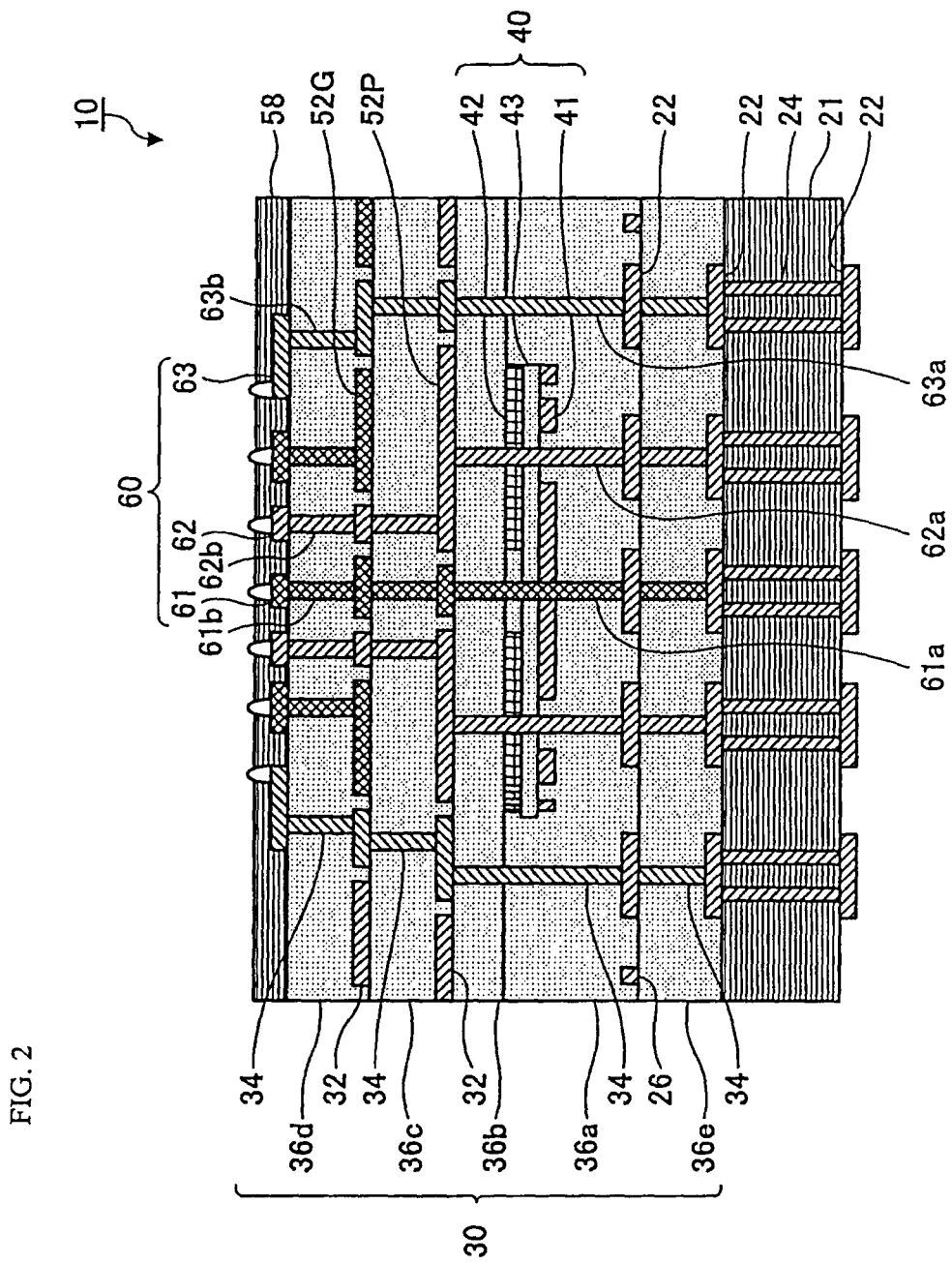
FIG. 2 illustrates another embodiment of the multilayer printed wiring board shown in FIG. 1.

On the top surface of core substrate 21, first alignment marks 26 are formed. First alignment marks 26 are used as a basis for alignment when laminating layered capacitor section 40 on interlayer resin insulation layer (the first interlayer resin insulation layer) (36a) on core substrate 21. First alignment marks 26 are formed at the same time as wiring pattern 22 using conductor such as copper, the same as wiring pattern 22. First alignment marks 26 are formed, for example, cross-shaped so as to be a mark when aligning positions. It is not necessary to form first alignment marks 26 on the top surface of core substrate 21. FIG. 2 shows an example in which first alignment marks 26 are formed on a layer other than the surface of core substrate 21. For example, one layer under interlayer resin insulation layer (36a) where layered capacitor section 40 is formed, third interlayer resin insulation layer (36e) (a layer on the side of core substrate 21) is formed, on which first alignment marks 26 may be formed.

In FIG. 1, built-up section 30 is structured on the top and bottom surfaces of core substrate 21 (for the purpose of simplification, only the top surface is shown in FIG. 1) by alternately laminating interlayer resin insulation layers 36 and wiring patterns 32. Each wiring pattern 32 is electrically connected through via conductors 34 which penetrate interlayer resin insulation layers 36. Here, via conductors 34 are conductive layers formed by plating conductor such as copper on the internal circumferences or in the interiors of the through-holes that penetrate interlayer resin insulation layers 36. The thickness of interlayer resin insulation layer 36 is preferably in the range of 0.02 mm-0.08 mm. Interlayer resin insulation layer 36 is an interlayer resin insulation layer made of inorganic filler and thermoset resin, or an interlayer insulation layer made of inorganic filler, thermoset resin and thermoplastic resin. It is preferred that glass cloth or glass fabric such as alamide non-woven fabric not be included.

Also, multilayer printed wiring board 10 has: Layered capacitor section 40 structured with high dielectric layer 43, and first layered electrode 41 and second layered electrode 42 sandwiching high dielectric layer 43; metal thin-film layers (52P, 52G) formed over layered capacitor section 40 via interlayer resin insulation layer 36; and mounting section 60 on which to mount a semiconductor element (not shown in the drawing).

Layered capacitor section 40 is structured with high dielectric layer 43 formed by sintering ceramic-type high dielectric material at a high temperature, and first layered electrode 41 and second layered electrode 42 sandwiching high dielectric layer 43. First layered electrode 41 is a nickel (Ni) electrode and is electrically connected to ground pads (first external terminals) 61 of mounting section 60. Second layered electrode 42 is a copper electrode and is connected to power-source pads (second external terminals) 62 of mounting section 60.

Layered capacitor section 40 is arranged over core substrate 21 via interlayer resin insulation layer 36 (36a). By connecting first layered electrode 41 to a ground line (not shown in the drawing) and second layered electrode 42 to a power-source line (not shown in the drawing), a predetermined level of electric charge is retained in layered capacitor section 40. Also, layered capacitor section 40 is connected through via conductors 34 to the semiconductor element (not shown in the drawing) mounted on mounting section 60. In case of a temporary voltage drop of electric power (external electric power) supplied from a power-source line, not shown in the drawing, to the semiconductor element, layered capacitor section 40 releases its electric charge to supply electric power to the semiconductor element.

First layered electrode 41 is a plane pattern formed on the bottom surface of high dielectric layer 43, and is electrically connected through via conductors for ground (ground via conductors) (61b) to ground pads 61. Also, first layered electrode 41 is connected through ground via conductors (first via conductors) (61a) to ground wiring (22G) as an example of ground conductive circuits formed on core substrate 21. In the side of layered capacitor section 40 where first layered electrode 41 is formed, opening portions (portions where first layered electrode 41 is not formed) (41a) are formed. Via conductors for power source (power-source via conductors) (second via conductors) (62a), which are electrically connected to power-source pads 62, pass through opening portions (41a) without making contact with first layered electrode 41 and are connected to power-source wiring (22P) as an example of power-source conductive circuits formed on core substrate 21.

Second layered electrode 42 is a plane pattern formed on the top surface of high dielectric layer 43, and is connected through power source via conductors (62b) to power-source pads 62. Also, in the side of layered capacitor section 40 where second layered electrode 42 is formed, opening portions (portions where second layered electrode 42 is not formed) (42a) are formed. Ground via conductors (61a), which are electrically connected to ground pads 61, pass through opening portions (42a) without making contact and are connected to ground pads 61.

High dielectric layer 43 is structured with high dielectric material containing one, or two or more kinds of metal oxides selected from a group of $BaTiO_3$, $SrTiO_3$, $TaO_3$, $Ta_2O_5$, PZT, PLZT, PNZT, PCZT, and PSZT. After making such high dielectric material into a 0.3-1.0 μm-thick thin-film layer and sintering to make ceramics, high dielectric layer 43 is formed. Since high dielectric layer 43 has a thickness in the above range, practically short-circuiting between first layered electrode 41 and second layered electrode 42 do not occur. A method of manufacturing layered capacitor section 40 will be described later.

Over layered capacitor section 40, metal thin-film layer (52P) is formed via second interlayer resin insulation layer (36b). Over metal thin-film layer (52P), metal thin-film layer (52G) is formed via interlayer resin insulation layer (36c). Metal thin-film layer (52P) is connected through via conductors 34 (power-source via conductors (62a)) to second layered electrode 42. Also, metal thin-film layer (52P) is connected through via conductors 34 (power-source via conductors (62b)) to power-source pads 62. Metal thin-film layer (52G) is connected through via conductors 34 (ground via conductors 61a) to first layered electrode 41. Also, metal thin-film layer (52G) is connected through via conductors 34 (ground via conductors (61b)) to ground pads 61. Here, since first layered electrode 41 is electrically connected to the ground line, metal thin-film layer (52G) is referred to as ground plane layer (52G). Since second layered electrode 42 is electrically connected to the power-source line, metal thin-film layer (52P) is referred to as power-source plane layer (52P).

Power-source plane layer (52P) and ground plane layer (52G) are formed via interlayer resin insulation layer 36 between layered capacitor section 40 and mounting section 60. Power-source plane layer (52P) is connected to second layered electrode 42 of layered capacitor section 40 and maintains the same electrical potential as second layered electrode 42, and ground plane layer (52G) is connected to first layered electrode 41 and maintains the same electrical potential. Therefore, layered capacitor section 40 or the semiconductor element may suppress the impact of the electrical potential at metal thin-film layers.

Figure 3:
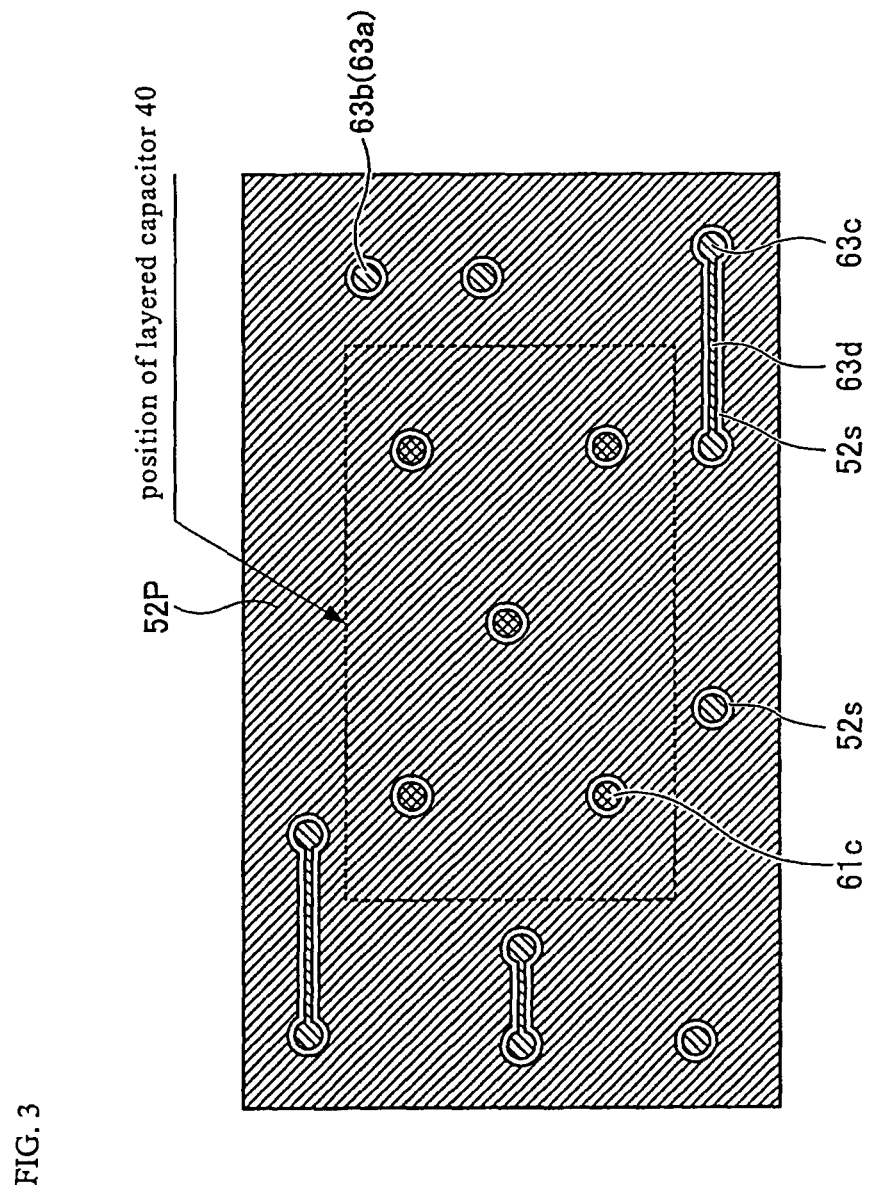
FIG. 3 is a view from above the multilayer printed wiring board illustrating the power-source plane layer of the multilayer printed wiring board shown in FIG. 1.

FIG. 3 is a view illustrating power-source layer (52P) seen from above the section line in FIG. 1. Power-source plane layer (52P) is a metal thin-film layer such as copper covering substantially the entire surface of second interlayer resin insulation layer (36b). FIG. 3 shows a case in which power-source plane layer (52P) covers substantially the entire surface of second interlayer resin insulation layer (36b). However, if power-source plane layer (52P) is positioned directly over layered capacitor section 40 and is at least larger than the peripheral configuration of layered capacitor section 40 (represented by the dotted lines in FIG. 3), it is sufficient. Namely, if power-source plane layer (52P) is directly over layered capacitor section 40 and its peripheral configuration is larger than the region enclosed by the dotted lines in FIG. 3, it is sufficient. As seen in FIG. 3, the left boundary of the dotted region in FIG. 3 does not extend beyond the space 52s of the signal land 63c thereby indicating that the layered capacitor section 40 is below the electrode 42. Inside power-source plane layer (52P), at least one of the following, the ground wiring and lands for ground (ground lands) (61c) or a conductive circuit for signals (signal wiring) (63d) and lands for signals (signal lands) (63c), is formed.

In addition, around the ground wiring and ground lands (61c) and signal wiring (63d) and signal lands (63c), spaces (52s), where conductor is not formed, are formed so as to prevent short-circuiting between power-source plane layer (52P) and the ground wiring or ground lands (61c), and between power-source layer (52P) and signal wiring (63d) or signal lands (63c). If power-source plane layer (52P) is characterized in such a way that the same electrical potential is maintained as second layered electrode 42 of layered capacitor section 40, then layered capacitor 40 or the semiconductor element (not shown in the drawing) mounted on mounting section 60 may suppress the impact of the electrical potential at power-source plane layer (52P).

In FIG. 1 again, via conductors for signals (signal via conductors) (63b) (63a), signal lands (63c) and signal wiring (63d) are electrically connected to signal pads 63. Signal lands (63c) either have signal via conductors (63b) formed on their top or are connected to signal wiring (63d). Ground via conductors (61b) (61a), ground lands (61c) and ground wiring (22G) are connected to ground pads 61. Ground lands (61c) are connected to at least either ground via conductors (61b) or ground wiring (22G). When via conductor 34 is formed directly over via conductor 34, or when via conductor 34 penetrates two layers of interlayer resin insulation layers (36a, 36b) simultaneously, a land is formed on the same layer as power-source plane layer (52P)

Layered capacitor section 40 is positioned on a layer closer to the center than power-source plane layer (52P) if seen from mounting section 60, and formed directly under the region surrounded by the dotted lines in FIG. 3. Namely, if seen from the side of mounting section 60, power-source plane layer (52P) has a region that includes at least layered capacitor section 40 (see FIG. 3). Since power-source plane layer (52P) is formed in the region directly over layered capacitor section 40, power-source plane layer (52P) functions to prevent humidity that intrudes through the surface of multilayer printed wiring board 10 from reaching layered capacitor section 40.

As shown in FIG. 3, on the layer where power-source plane layer (52P) is formed, the accumulated areas (the areas of the conductors within the region surrounded by the dotted lines in FIG. 3), which are the total areas of top surfaces of the conductors formed in the region (the region surrounded by the dotted lines in FIG. 3) positioned directly over layered capacitor section 40, are preferred to be more than 80% of the area (the area surrounded by the dotted lines in FIG. 3) where layered capacitor section 40 is formed. Here, the accumulated areas are those that exclude spaces (52s), but include, other than power-source plane layer (52P), the areas of wiring and lands formed in power-source plane layer (52P) and top surfaces of via conductors 34.

In addition, within power-source plane layer (52P) (the region surrounded by the dotted lines) directly over layered capacitor section 40, to remove the influence of noise on signals as much as possible, or to minimize the reduction of the conductor area by spaces (52s), it is preferred that signal wiring (63d), signal via conductors (63b) and lands (63c) not be formed.

In FIG. 1, mounting section 60 is formed over power-source plane layer (52P) and ground plane layer (52G) via interlayer resin insulation layer 36 (36c or 36d), and is electrically connected to first layered electrode 41 and second layered electrode 42 of layered capacitor section 40 through via conductors 34. Also, mounting section 60 mounts a semiconductor element on its surface (not shown in the drawing).

Mounting section 60 is the region where a semiconductor element (not shown in the drawing) is mounted. On the surface of multilayer printed wiring board 10, ground pads 61, power-source pads 62 and signal pads 63 are arranged to form mounting section 60. Ground pads 61 are connected to first layered electrode 41 of layered capacitor section 40, and power-source pads 62 are connected to second layered electrode 42.

In the embodiment shown in FIG. 1, signal via conductors (63a) electrically connected to signal pads 63 are formed outside the region where layered capacitor section 40 is formed without penetrating layered capacitor section 40. However, signal via conductors (63a) may be arranged so as to penetrate layered capacitor section 40. In such a case, signal via conductors (63a) are formed inside opening portions (41a, 42a) of first layered electrode 41 and second layered electrode 42, and penetrate layered capacitor section 40 without making contact with first layered electrode 41 and second layered electrode 42.

Between mounting section 60 and layered capacitor section 40, power-source plane layer (52P) and ground plane layer (52G) are formed. Accordingly, humidity that intrudes from the surface of multilayer printed wiring board 10 is prevented from reaching layered capacitor section 40. In contrast, on the side of first layered electrode 41 (opposite mounting section 60) of layered capacitor section 40, core substrate 21 is positioned. Therefore, it is not always necessary to form a metal thin-film layer to prevent the intrusion of humidity. However, between the opposite surface to mounting section 60 of multilayer printed wiring board 10 and layered capacitor section 40, a metal thin-film layer may be formed.

Next, a method of manufacturing multilayer printed wiring board 10 according to the embodiment shown in FIG. 1 is described. The procedures to form through-hole conductors 24 in core substrate 21 and the procedures to form wiring patterns 22 on core substrate 21 are well known. Thus, the method of manufacturing built-up section 30 and layered capacitor section 40 is mainly described here.

Figure 4:
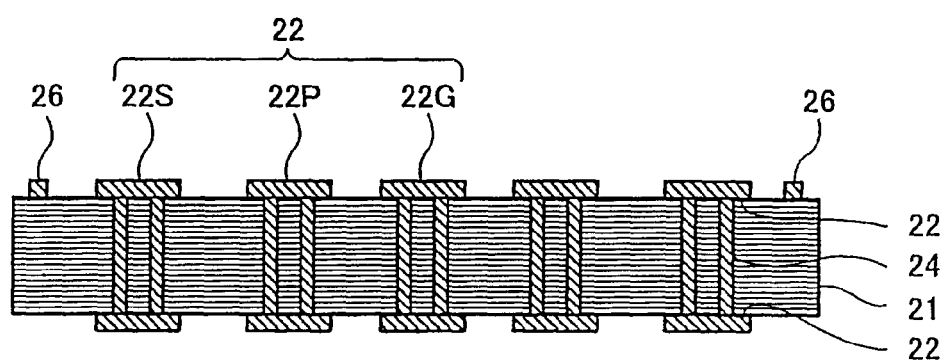
FIG. 4a is a view illustrating a step for manufacturing the multilayer printed wiring board shown in FIG. 1.
FIG. 4b is a view illustrating a step for manufacturing the multilayer printed wiring board shown in FIG. 1.
Figure 4:
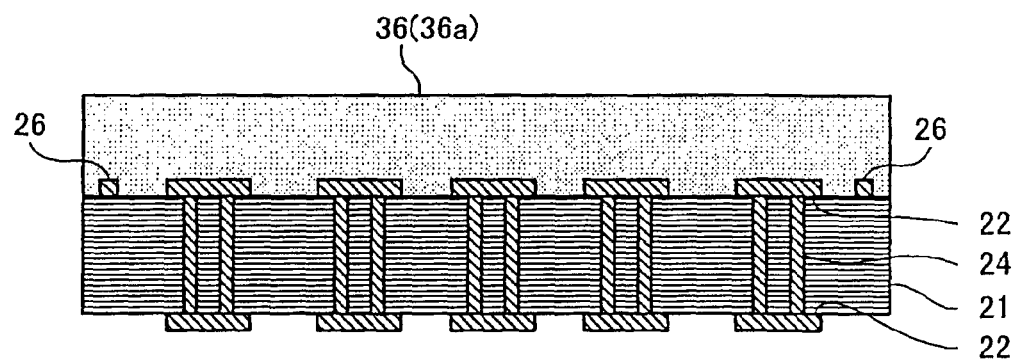

FIG. 4a and FIG. 4b are views illustrating the steps of manufacturing multilayer printed wiring board 10. As shown in FIG. 4a, core substrate 21 has through-hole conductors 24 made of copper formed on the inner-wall surfaces of penetrating holes (through-holes) that pierce the top and bottom surfaces. Also, on the top and bottom surfaces (on the insulation layer) of core substrate 21, wiring patterns 22 are structured with copper. Wiring patterns 22 on the top and bottom surfaces are electrically connected via through-hole conductors 24. Wiring patterns (conductive circuits) 22 consist of signal wiring (22S) as an example of conductive circuit for signals, power-source wiring (22P) and ground wiring (22G).

On core substrate (insulation layer) 21, in addition to wiring patterns 22, first alignment marks 26 as a basis for alignment are formed. First alignment marks 26 are structured with copper, and formed simultaneously with wiring patterns 22 by the same procedure. First alignment marks 26 are used as the basis for alignment when arranging later-described layered capacitor section 40 at a predetermined position.

Then, as shown in FIG. 4(b), a resin sheet to make first interlayer resin insulation layer (36a) is laminated on core substrate 21 using a vacuum laminator. Here, the resin sheet is formed with denatured epoxy-type resin sheet, polyphenylene ether-type resin sheet, polyimide-type resin sheet, cyano-ester-type resin sheet or the like and is approximately 20-80 μm thick. Its Young's modulus is 2-7 GPa at room temperature. Here, the resin sheet may include inorganic particles such as silica, alumina or zirconia.

Here, layered capacitor section 40 is manufactured as follows.

Figure 5:
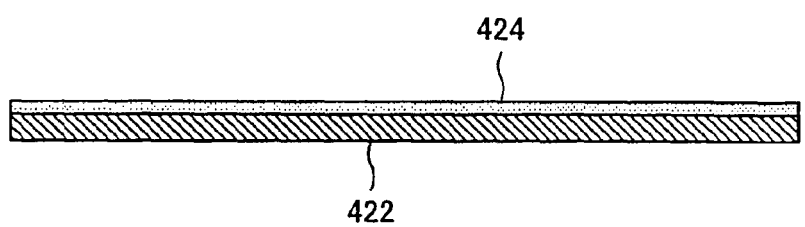
FIG. 5a is a view illustrating a step for manufacturing the layered capacitor section of the multilayer printed wiring board shown in FIG. 1.
FIG. 5b is a view illustrating a step for manufacturing the layered capacitor section of the multilayer printed wiring board shown in FIG. 1.
FIG. 5c is a view illustrating a step for manufacturing the layered capacitor section of the multilayer printed wiring board shown in FIG. 1.
Figure 5:
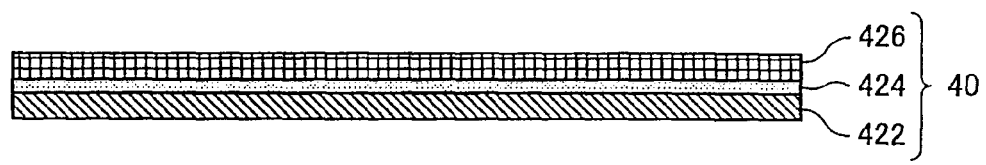
Figure 5:
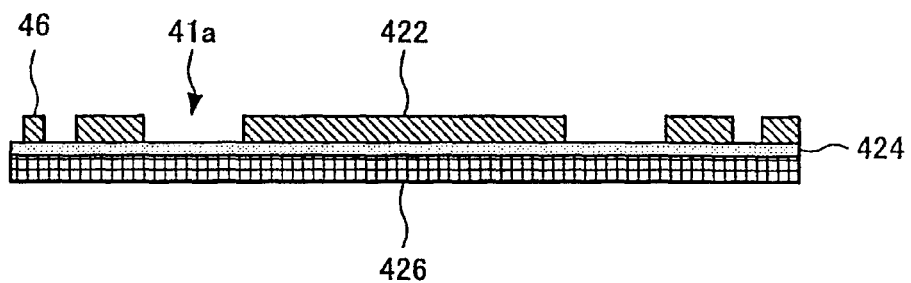

FIG. 5a and FIG. 5b are views illustrating the steps of manufacturing layered capacitor section 40. After thermoprocessing an approximately 100 μm-thick nickel (Ni) foil (which later becomes first layered electrode 41, a ground electrode) at about 1,000° C., both surfaces are polished to be 10-90 μm thick to make electrode 422.

Then, a sol-gel solution containing one or two or more kinds of metal oxides selected from a group of $BaTiO_3$, $SrTiO_3$, $TaO_3$, $Ta_2O_5$, PZT, PLZT, PNZT, PCZT and PSZT is applied on electrode 422 by a spin-coater to form an unsintered layer of sol-gel film on electrode 422. As seen in FIG. 5a, after the application, the unsintered layer is sintered in a vacuum atmosphere or in a non-oxidation atmosphere such as $N_2$ gas at temperatures in the range of 600-950° C. to form 0.3-1.0 μm-thick high dielectric layer 424 on the Ni foil.

Here, an example of sol-gel solution is described.

First, diethoxy barium and diisopropoxy titanium are dissolved in a mixed solvent of dehydrated methanol and 2-methoxyethanol, and blended for three days under a nitrogen atmosphere at room temperature to prepare a precursor compound solution of barium-titanium alkoxide. Then, the precursor compound solution is blended while being maintained at 0° C. and hydrolyzed with water decarbonized in advance and sprayed at a rate of 0.5 microliter/minute in nitrogen current. The sol-gel solution prepared as above is filtered to filter extracts or the like. After the filtration, the sol-gel precursor solution is applied on electrode 422. The thickness of high dielectric layer 424 after being sintered is controlled by adjusting the rotational speed of the spin-coater, the viscosity and concentration of the sol-gel solution and the number of applications.

Using vacuum deposition equipment such as sputtering, a copper seed layer is formed on high dielectric layer 424. Then, in FIG. 5b, by adding copper for about 10 μm onto the seed layer by electrolytic plating or the like, electrode 426 (which later becomes second layered electrode 42, a power-source electrode) is formed and layered capacitor section 40 is obtained. Then, as shown in FIG. 5c, electrode 422 is patterned. At that time, alignment marks 46 (second alignment marks) as the basis for alignment and opening portions (41a) are formed simultaneously on electrode 422. Here, the positions to form opening portions (41a) are those to form via conductors 34 (see FIG. 1) which penetrate first layered electrode 41 without making contact. The diameter of the opening portions is larger than that of via conductors 34. Second alignment marks 46 are formed, for example, as cross-shaped marks.

Here, first alignment marks 26 are preferred to be formed on an interlayer resin insulation layer (for example, 36a) or an insulation layer positioned closer to the side of core substrate 21 (the side opposite mounting section 60) than interlayer resin insulation layer 36 (see FIG. 1) having either built-in or laminated layered capacitor section 40. Also, layered capacitor section 40 is preferred to have second alignment marks 46 to be used as a basis for alignment. If layered capacitor section 40 has second alignment marks 46, layered capacitor section 40 may be laminated on interlayer resin insulation layer 36 based on first alignment marks 26 formed on the insulation layer and second alignment marks 46 formed on layered capacitor section 40. Accordingly, layered capacitor section 40 may be formed at the specified position on interlayer resin insulation layer 36.

As above, if first alignment marks 26 are formed on core substrate 21 and second alignment marks 46 are formed on layered capacitor section 40, second alignment marks 46 of layered capacitor section 40 may be aligned at predetermined positions with regard to first alignment marks 26 formed on core substrate 21. As a result, based on first and second alignment marks (26, 46), layered capacitor section 40 is formed at a proper position on interlayer resin insulation layer 36. Also, first alignment marks 26 formed on core substrate 21 are formed simultaneously with ground wiring (22G) and power-source wiring (22P) on core substrate 21. Therefore, based on first alignment marks 26 and second alignment marks 46 formed on layered capacitor section 40, both are positioned so that ground wiring (22G) and power-source wiring (22P) on core substrate 21 and layered capacitor section 40 are aligned accurately.

As shown in FIG. 2, if first alignment marks 26 are formed on third interlayer resin insulation layer (36e) (third interlayer resin insulation layer (36e) is arranged between core substrate 21 and first interlayer resin insulation layer (36a)) positioned closer to the side of core substrate 21 (the side opposite mounting section 60) than interlayer resin insulation layer 36 (36a) having either built-in or laminated layered capacitor section 40, the same as in the case of first alignment marks 26 formed on core substrate (see FIG. 1), layered capacitor section 40 may be formed at a proper position on third interlayer resin insulation layer (36e) based on first and second alignment marks (26, 46).

Also, first alignment marks 26 formed on third interlayer resin insulation layer (36e) are formed simultaneously with wiring patterns 22 (which include power-source wiring (22P), ground wiring (22G) and signal wiring (22S)) on third interlayer resin insulation layer (36e). Therefore, based on first alignment marks 26 and second alignment marks 46 formed on layered capacitor section 40, both are positioned so as to accurately align wiring patterns 22 on third interlayer resin insulation layer (36e) and layered capacitor section 40.

Figure 6:
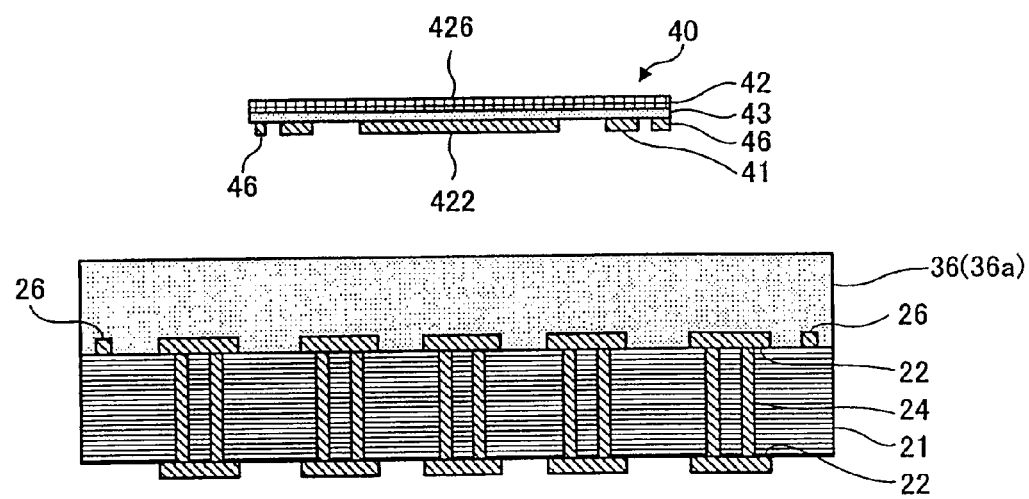
FIG. 6a is a view illustrating a step for manufacturing the multilayer printed wiring board shown in FIG. 1.
FIG. 6b is a view illustrating a step for manufacturing the multilayer printed wiring board shown in FIG. 1.
Figure 6:
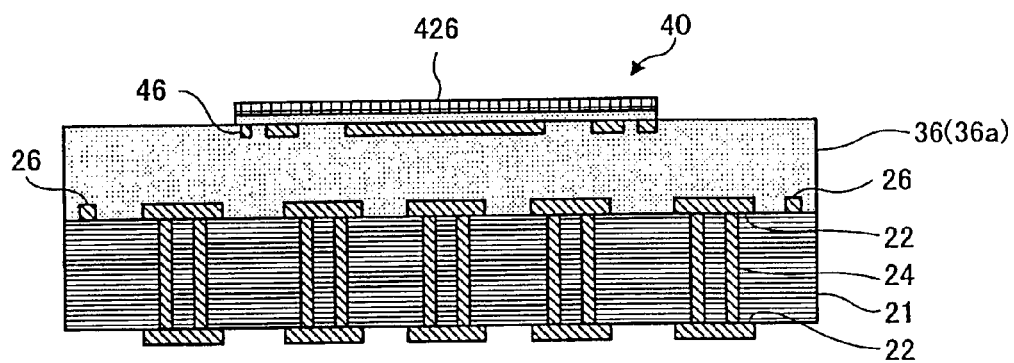
Figure 7:
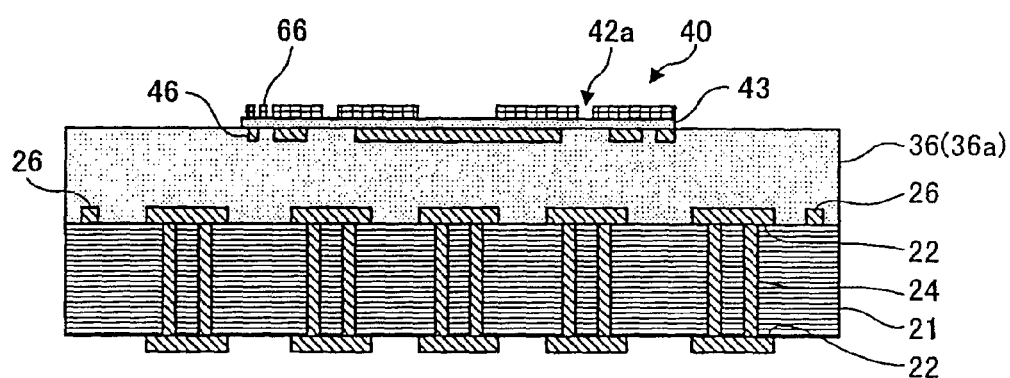
FIG. 7a is a view illustrating a step for manufacturing the multilayer printed wiring board shown in FIG. 1.
FIG. 7b is a view illustrating a step for manufacturing the multilayer printed wiring board shown in FIG. 1.
Figure 7:
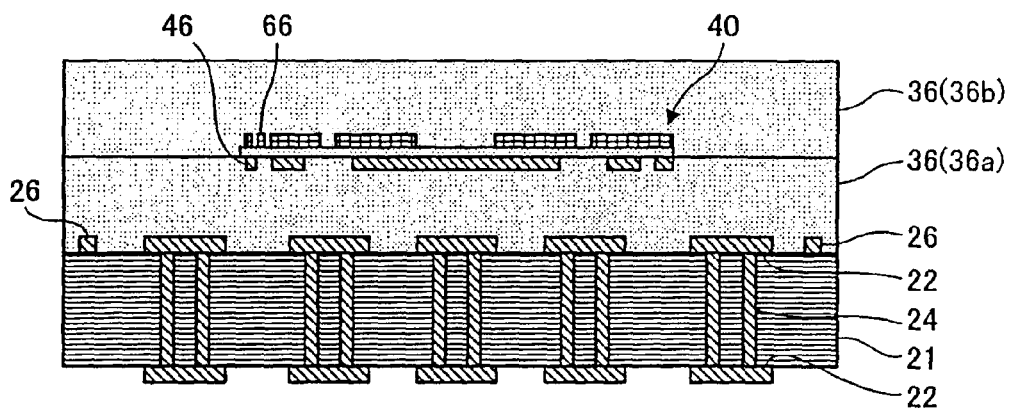
Figure 8:
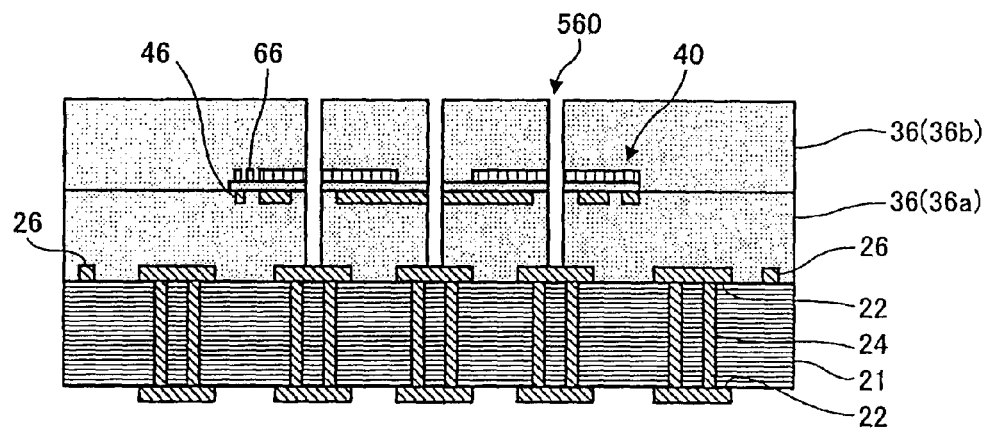
FIG. 8a is a view illustrating a step for manufacturing the multilayer printed wiring board shown in FIG. 1.
FIG. 8b is a view illustrating a step for manufacturing the multilayer printed wiring board shown in FIG. 1.
Figure 8:
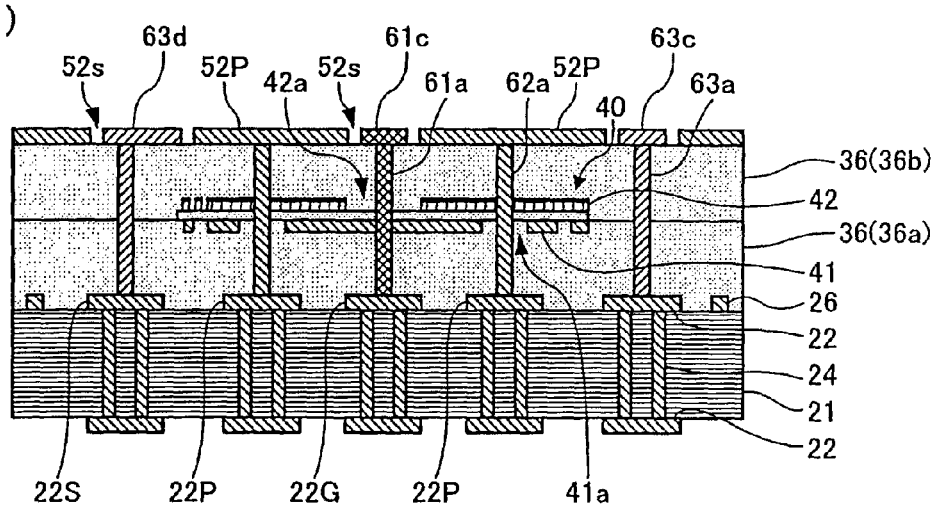
Figure 9:
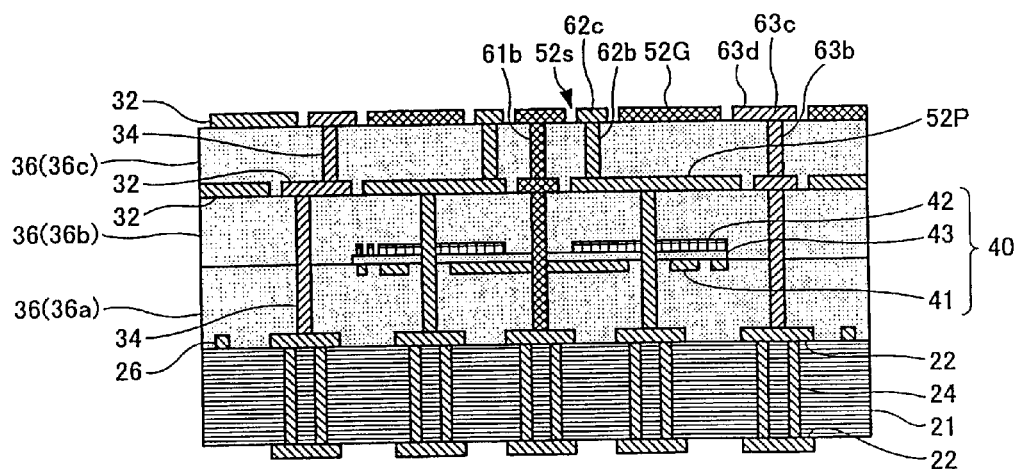
FIG. 9a is a view illustrating a step for manufacturing the multilayer printed wiring board shown in FIG. 1.
FIG. 9b is a view illustrating a step for manufacturing the multilayer printed wiring board shown in FIG. 1.
Figure 9:
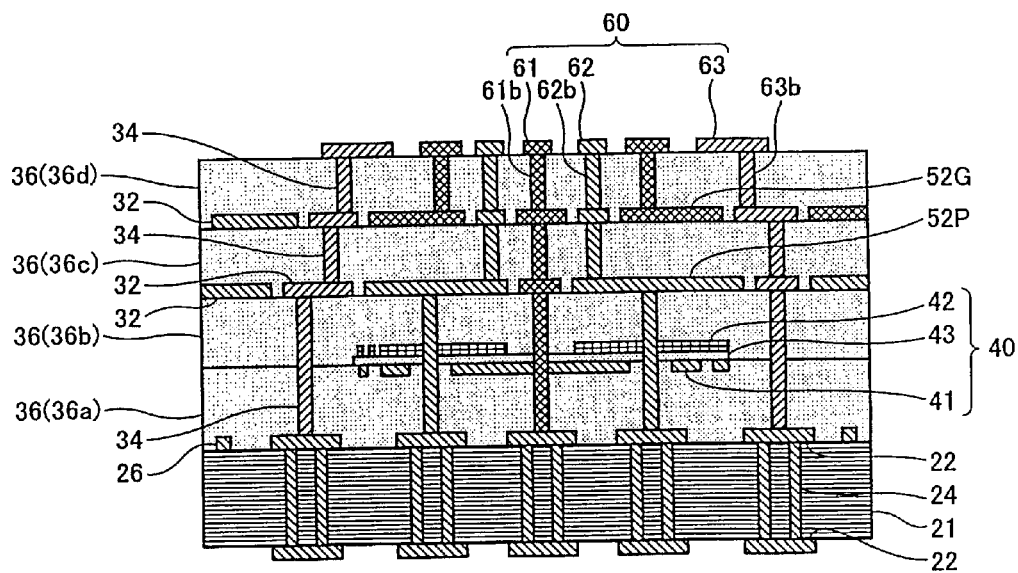

Returning to describing the method of manufacturing multilayer printed wiring board 10; FIGS. 6-10 are views illustrating the steps of manufacturing multilayer printed wiring board 10. In FIG. 6a, based on first alignment marks 26 formed on core substrate 21 and second alignment marks 46 formed on layered capacitor section 40, layered capacitor section 40 is aligned at a predetermined position over core substrate 21. As can be seen in FIG. 6b, after that, layered capacitor section 40 is laminated on interlayer resin insulation layer 36 by a vacuum laminator.

Next, based on at least either first alignment marks 26 or second alignment marks 46, electrode 426 of layered capacitor section 40 is patterned. Patterning electrode 426 is conducted by laminating a dry film on electrode 426, and by exposing to light, developing, etching and removing the film, which is a standard procedure when patterning multilayer printed wiring board 10.

As shown in FIG. 7a, simultaneously with the patterning, third alignment mark 66 is formed on high dielectric layer 43. Since patterning electrode 426 (see FIG. 6b) is conducted based on at least first alignment marks 26 or second alignment marks 46, the position of the wiring pattern to be formed is set properly with regard to the patterned position of wiring patterns 22 formed on core substrate 21. At the patterning step, from the positions of through-holes (42a) that penetrate layered capacitor section 40, copper (electrode 426 (see FIG. 6b)) is removed in advance.

Next, as shown in FIG. 7b, an insulation sheet is laminated on layered capacitor section 40 to form second interlayer resin insulation layer (36b).

Next, in FIG. 8a, in the unfinished substrate with laminated second interlayer resin insulation layer (36b), based on either one of first alignment marks 26, second alignment marks 46 or third alignment mark 66, via holes 560 are formed by a $CO_2$ laser or UV laser. Via holes 560 penetrate second interlayer resin insulation layer (36b) on layered capacitor section 40, layered capacitor section 40, and first interlayer resin insulation layer (36a) beneath layered capacitor section 40, and reach wiring patterns 22 on core substrate 21. Since via holes 560 are formed based on any of the three alignment marks (26, 46, 66), they may be aligned accurately with regard to wiring patterns 22 on core substrate 21 and opening portions (41a, 42a) of layered capacitor section 40. To prevent accumulating errors, via holes 560 are preferred to be formed based on first alignment marks 26.

In the following, as shown in FIG. 8b, through a process of performing chemical copper plating, forming plating resist, performing electrolytic copper plating, removing plating resist, and removing chemical copper plated film, via holes 560 are filled with copper to form via conductors (ground via conductors (61a), power-source via conductors (62a), signal via conductors (63a)), and power-source plane layer (52P) is formed as well.

First layered electrode 41 of layered capacitor section 40 is electrically connected to ground wiring (22G) formed on core substrate 21 through first via conductors (61a). Also, second layered electrode 42 of layered capacitor section 40 is electrically connected to power-source wiring (22P) formed on core substrate 21 through power-source via conductors (62a). Here, ground via conductors (61a) and power-source via conductors (62a) are via conductors formed in via holes 560 as seen in FIG. 8a, which are formed based on either first alignment marks 26, second alignment marks 46 or third alignment mark 66. Thus, wiring between first layered electrode 41 of layered capacitor section 40 and ground wiring (22G) formed on core substrate 21, and between second layered electrode 42 of layered capacitor section 40 and power-source wiring (22P) formed on core substrate 21 is properly connected through via conductors (61a, 62a) respectively.

As shown in FIG. 2, in a case where third interlayer resin insulation layer (36e) is formed between core substrate 21 and first interlayer resin insulation layer (36a), and where first alignment marks 26, power-source wiring (22P) and ground wiring (22G) are formed on third interlayer resin insulation layer (36e), the same as above, via holes are formed based on either first alignment marks 26, second alignment marks 46 or third alignment mark 66. Accordingly, wiring between first layered electrode 41 of layered capacitor section 40 and ground wiring (22G) formed on third interlayer resin insulation layer (36e), and between second layered electrode 42 of layered capacitor section 40 and power-source wiring (22P) formed on third interlayer resin insulation layer (36e) is properly connected through via conductors (61a, 62a) respectively.

Returning to describing the method of manufacturing multilayer printed wiring board 10; in FIG. 9a, like the step described with reference to FIG. 8a, using a $CO_2$ laser or the like, via holes are formed in interlayer resin insulation layer 36 (36c) formed on power-source plane layer (52P). Then, via holes are filled with copper to form via conductors (61b, 62b, 63b) and ground plane layer (52G). This is accomplished through the following process: performing chemical copper plating, forming plating resist, performing electrolytic copper plating, removing plating resist and removing chemical copper plated film.

In the same layer as ground plane layer (52G), at least one of the following, signal via conductors (63b), signal lands (63c), signal wiring (63d), power-source via conductors (62b), lands for power-source (power-source lands) (62c) or power-source wiring, is formed. Around signal via conductors (63b), signal lands (63c), signal wiring (63d), power-source via conductors (62b), power-source lands (62c) and power-source wiring, regions without conductor (spaces) (52s) are formed. Signal via conductors (63b), signal lands (63c) and signal wiring (63d) are electrically connected to signal pads 63 (see FIG. 1). Signal lands (63c) either have signal via conductors (63b) formed on them or are connected to signal wiring (63d). Power-source via conductors (62b), power-source lands (62c) and power-source wiring are connected to power-source pads 62 (see FIG. 1). Power-source lands (62c) either will have power-source via conductors formed on them in a later step, or are connected to power-source wiring.

As shown in FIG. 9b, in the following, through the same steps as described above, on ground plane layer (52G), outermost interlayer resin insulation layer (36d) is formed and via conductors 34 (61b, 62b, 63b) that penetrate outermost interlayer resin insulation layer (36d) are formed. Also, on outermost interlayer resin insulation layer (36d), ground pads 61, power-source pads 62 and signal pads 63 are formed. Here, ground pads 61, power-source pads 62 and signal pads 63 construct mounting section 60.

Figure 10:
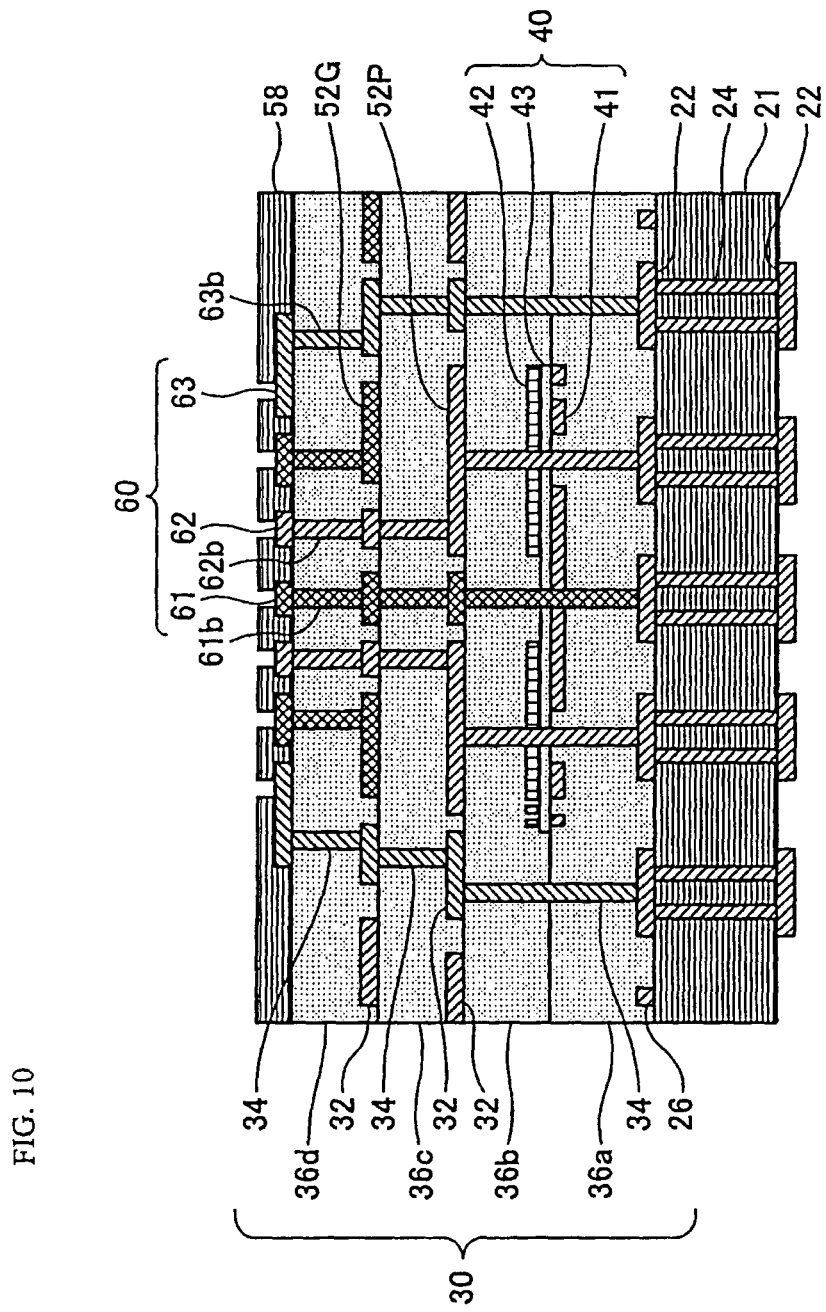
FIG. 10 is a view illustrating the steps for manufacturing the multilayer printed wiring board shown in FIG. 1.
Figure 11:
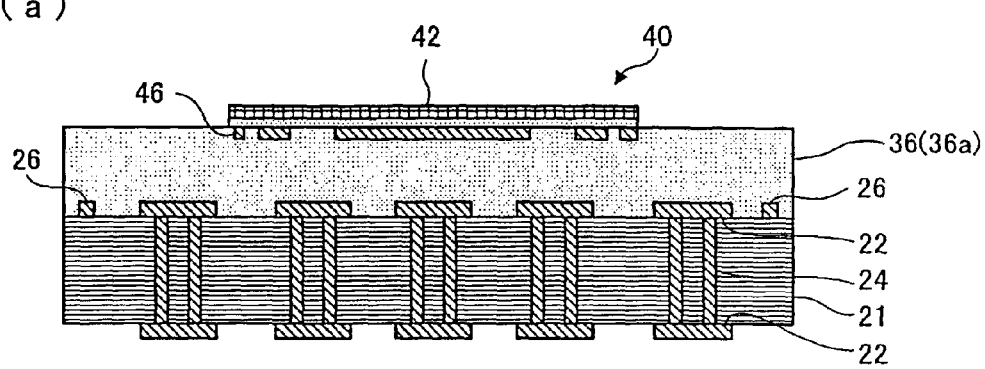
FIG. 11a is a view illustrating a step for manufacturing another embodiment of the multilayer printed wiring board shown in FIG. 1.
FIG. 11b is a view illustrating a step for manufacturing another embodiment of the multilayer printed wiring board shown in FIG. 1.
Figure 11:
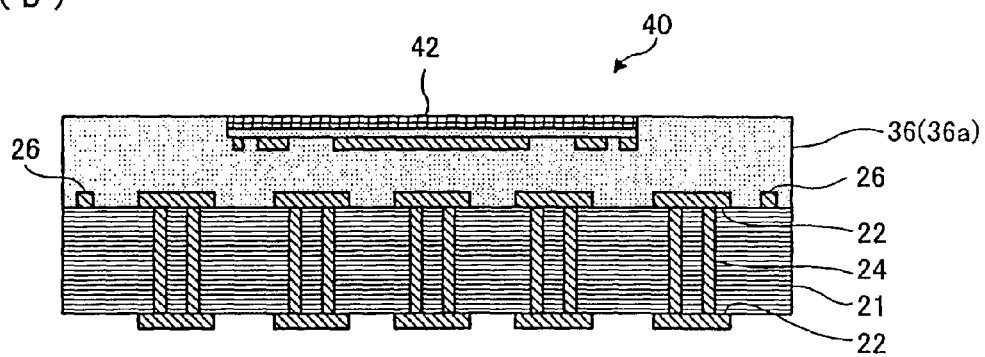

Then, in FIG. 10, after a commercially available solder-resist compound is applied, solder-resist layer 58 with opening portions that expose top surfaces of ground pads 61, power-source pads 62 and signal pads 63 is formed. Then, solder bumps are formed on three pads (61, 62, 63) in the opening portions of the solder-resist (see FIG. 1). In doing so, multilayer printed wiring board 10 is complete.

Also, in this embodiment, as metal thin-film layers, two layers such as power-source plane layer (52P) and ground plane layer (52G) are formed. However, the metal thin-film layer may be formed as one layer. Although the metal thin-film layer may be a dummy pattern without connecting either the power-source or ground, it is preferred to maintain the same electrical potential as that of either first or second layered electrode (41, 42) of layered capacitor section 40. Layered capacitor section 40 or the semiconductor element may suppress the impact of the electrical potential at the metal thin-film layer.

FIGS. 11-14 are views illustrating the steps of manufacturing another embodiment. Although alignment marks are not shown in those drawings, same as in the embodiment in FIG. 1, all sorts of alignment marks are formed on layered capacitor section 40 or core substrate 21. In the embodiment in FIG. 1, layered capacitor section 40 was laminated on first interlayer resin insulation layer (36a); and over layered capacitor section 40, metal thin-film layer 52 was formed on second interlayer resin insulation layer (36b). In contrast, according to the embodiment described below as illustrated in FIG. 11b, the following differ from the embodiment in FIG. 1: Layered capacitor section 40 is buried in first interlayer resin insulation layer (36a); and a metal thin-film layer is formed over second layered electrode 42 of layered capacitor section 40 and on first interlayer resin insulation layer (36a) in which layered capacitor section 40 is buried.

FIG. 11a shows, as shown in the embodiment in FIG. 7a, the phase after layered capacitor section 40 was laminated on first interlayer resin insulation layer (36a). Since the steps before that are substantially the same as in the embodiment in FIG. 7a, the description is omitted.

After layered capacitor section 40 was laminated on first interlayer resin insulation layer (36a), under the pressing conditions of 0.4 MPa at 170° C. for two hours, layered capacitor section 40 is vacuum-pressed so as to bury it in first interlayer resin insulation layer (36a) as well as cure first interlayer resin insulation layer (36a).

FIG. 11b illustrates the view after layered capacitor section 40 was buried in first interlayer resin insulation layer (36a). By the same method described with reference to FIG. 7a, based on the alignment marks not shown in the drawing, second layered electrode 42 of layered capacitor section 40 is patterned. At that time, from the positions for holes (opening portions) that penetrate layered capacitor section 40, portions of second layered electrode 42 are removed in advance.

FIG. 12a illustrates a view after opening portions (42a) were formed in second layered electrode 42 using alignment marks 26 on core substrate 21. Directly under opening portions (42a), wiring patterns 22 (22S, 22P, 22G) on core substrate 21 are positioned.

Figure 12:
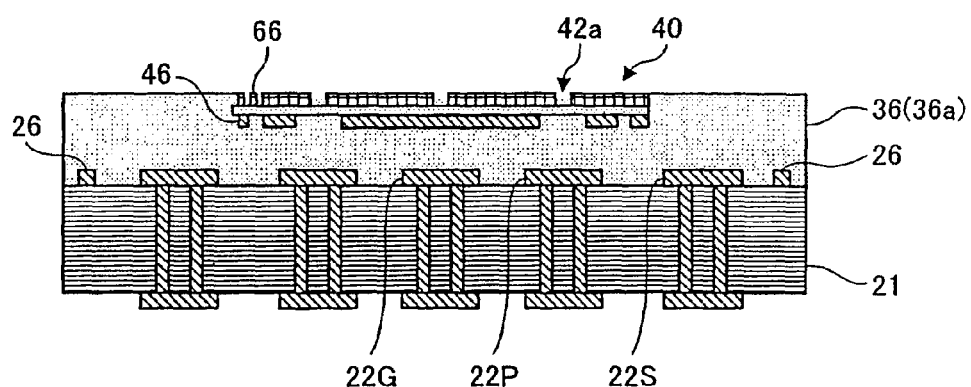
FIG. 12a is a view illustrating a step for manufacturing another embodiment of the multilayer printed wiring board shown in FIG. 1.
FIG. 12b is a view illustrating a step for manufacturing another embodiment of the multilayer printed wiring board shown in FIG. 1.
Figure 12:
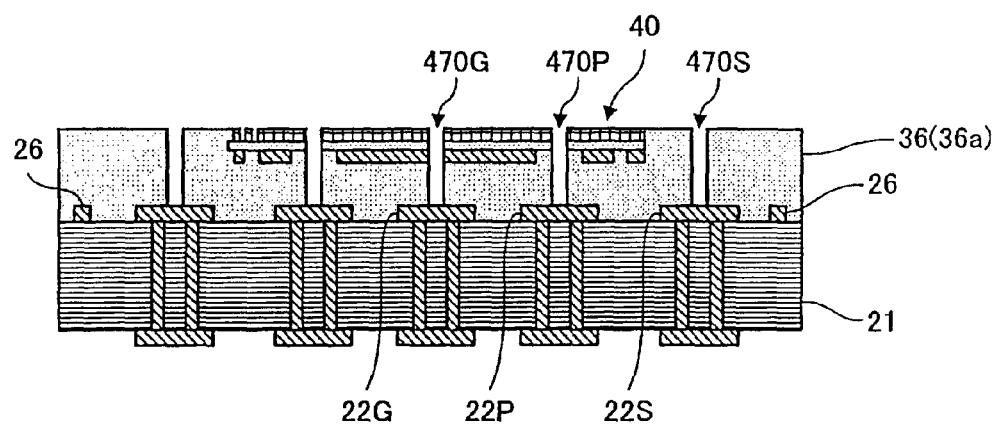
Figure 13:
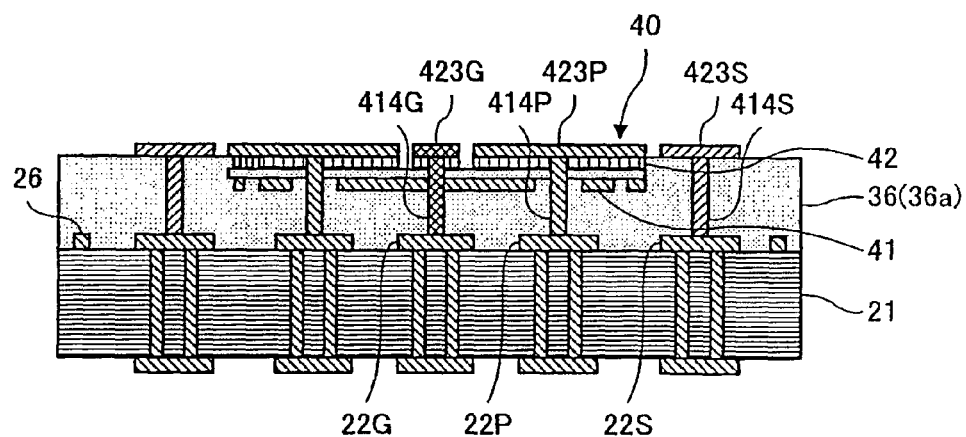
FIG. 13a is a view illustrating a step for manufacturing another embodiment of the multilayer printed wiring board shown in FIG. 1.
FIG. 13b is a view illustrating a step for manufacturing another embodiment of the multilayer printed wiring board shown in FIG. 1.
Figure 13:
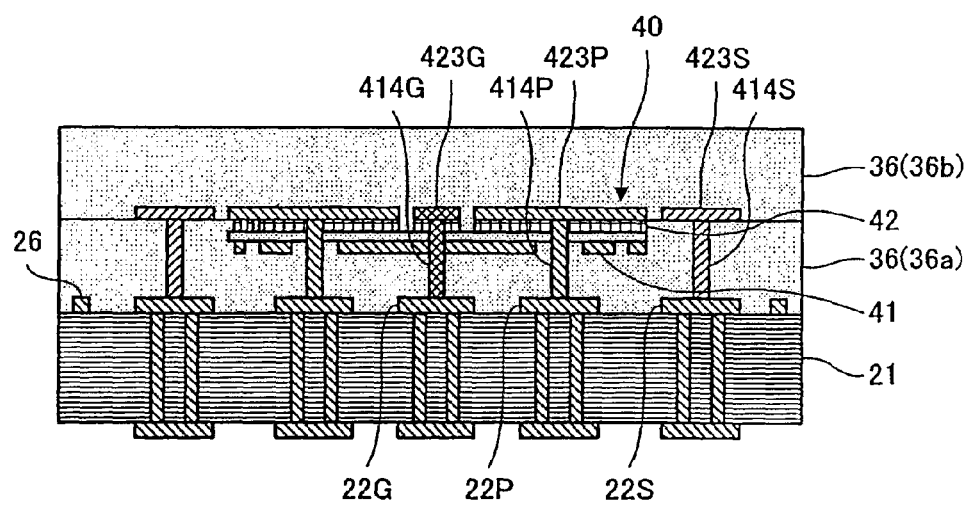
Figure 14:
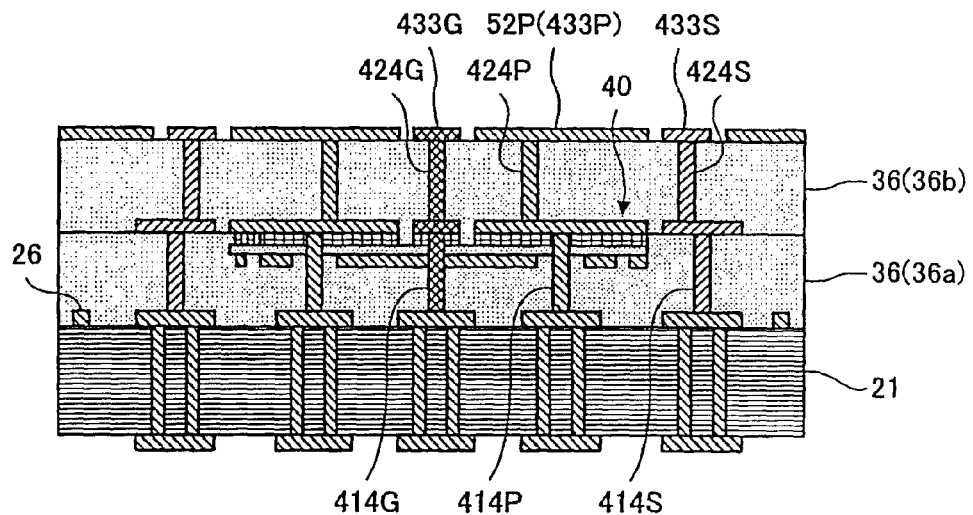
FIG. 14a is a view illustrating a step for manufacturing another embodiment of the multilayer printed wiring board shown in FIG. 1.
FIG. 14b is a view illustrating a step for manufacturing another embodiment of the multilayer printed wiring board shown in FIG. 1.
Figure 14:
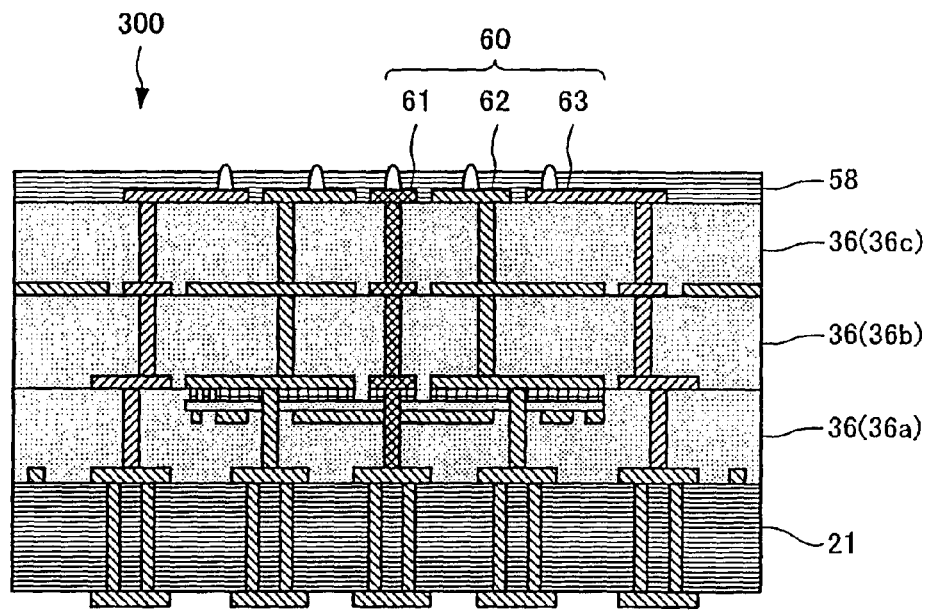
Figure 15:
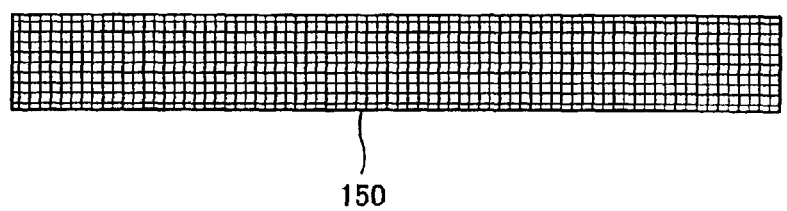
FIG. 15a is a view illustrating a step for manufacturing a printed wiring board according to an embodiment.
FIG. 15b is a view illustrating a step for manufacturing a printed wiring board according to an embodiment.
FIG. 15c is a view illustrating a step for manufacturing a printed wiring board according to an embodiment.
Figure 15:
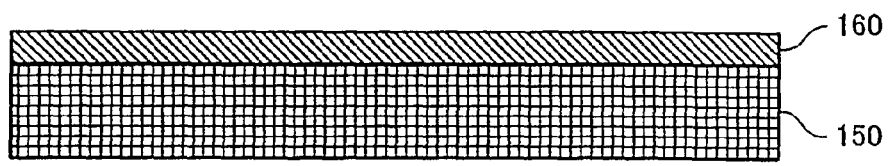
Figure 15:
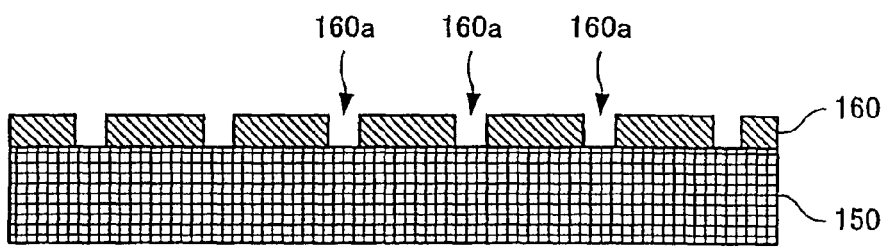
Figure 16:
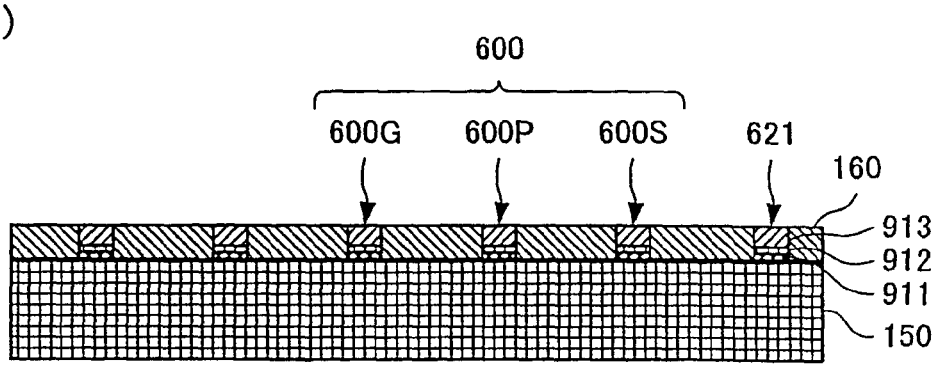
FIG. 16a is a view illustrating a step for manufacturing a printed wiring board according to an embodiment.
FIG. 16b is a view illustrating a step for manufacturing a printed wiring board according to an embodiment.
FIG. 16c is a view illustrating a step for manufacturing a printed wiring board according to an embodiment.
Figure 16:
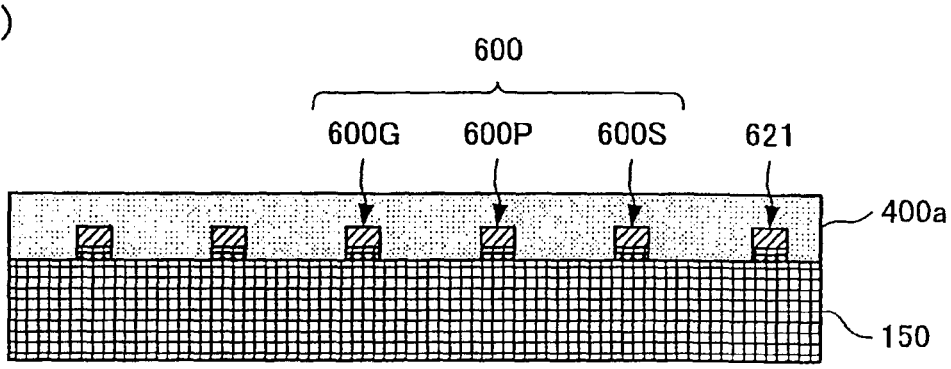
Figure 16:
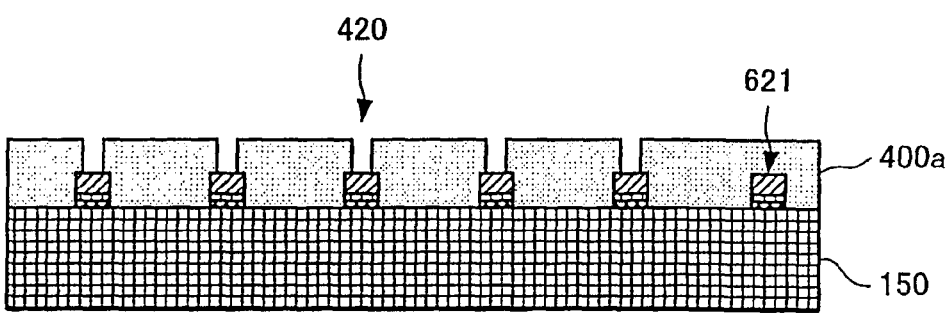
Figure 17:
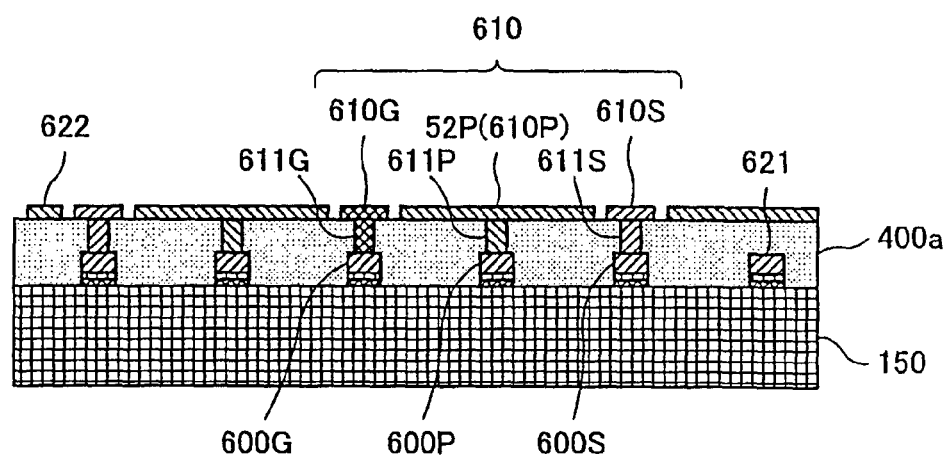
FIG. 17a is a view illustrating a step for manufacturing a printed wiring board according to an embodiment.
FIG. 17b is a view illustrating a step for manufacturing a printed wiring board according to an embodiment.
Figure 17:
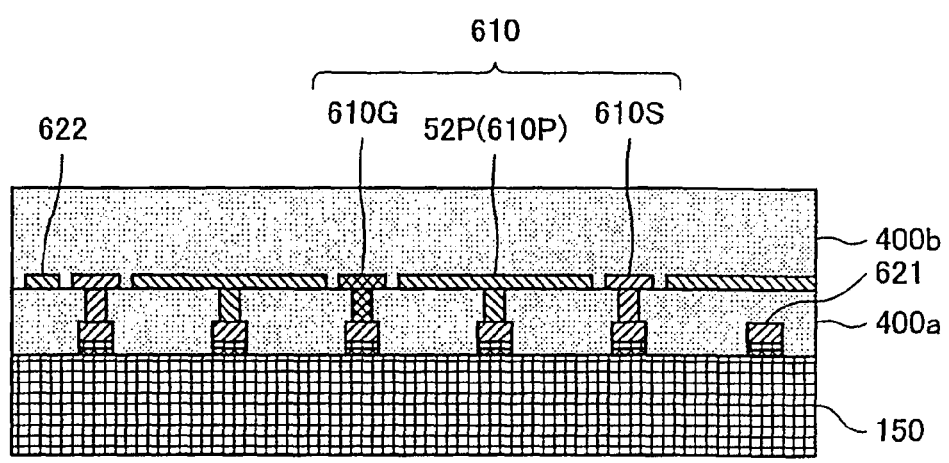
Figure 18:
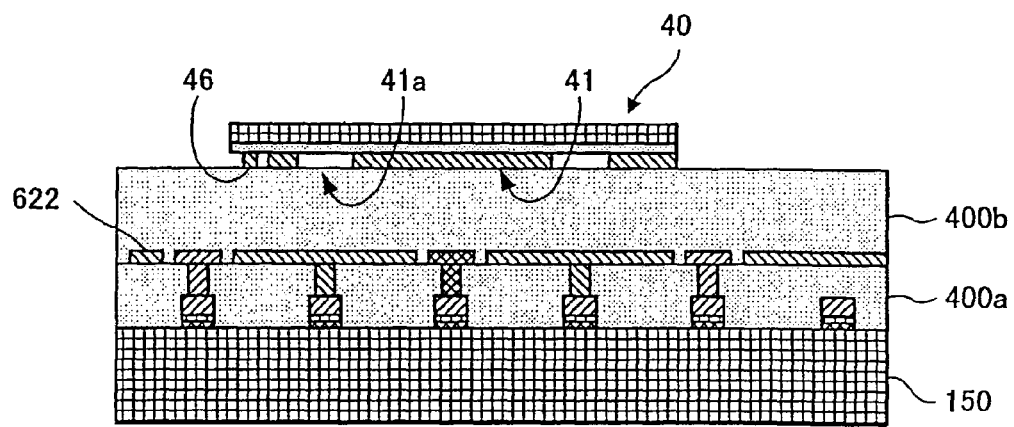
FIG. 18a is a view illustrating a step for manufacturing a printed wiring board according to an embodiment.
FIG. 18b is a view illustrating a step for manufacturing a printed wiring board according to an embodiment.
Figure 18:
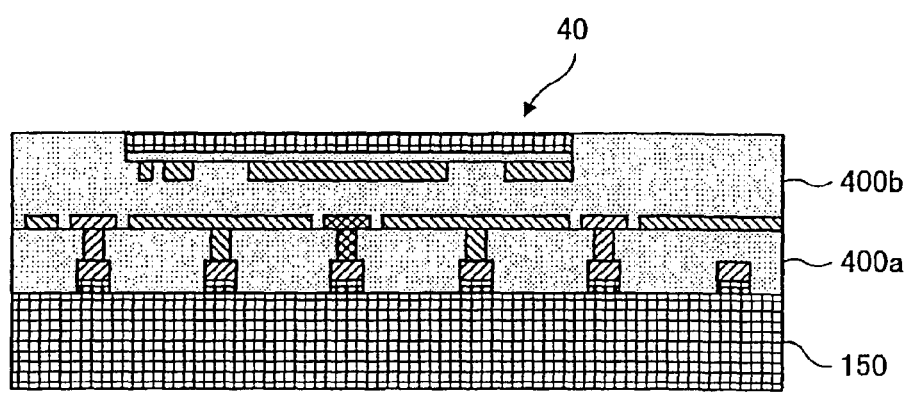
Figure 19:
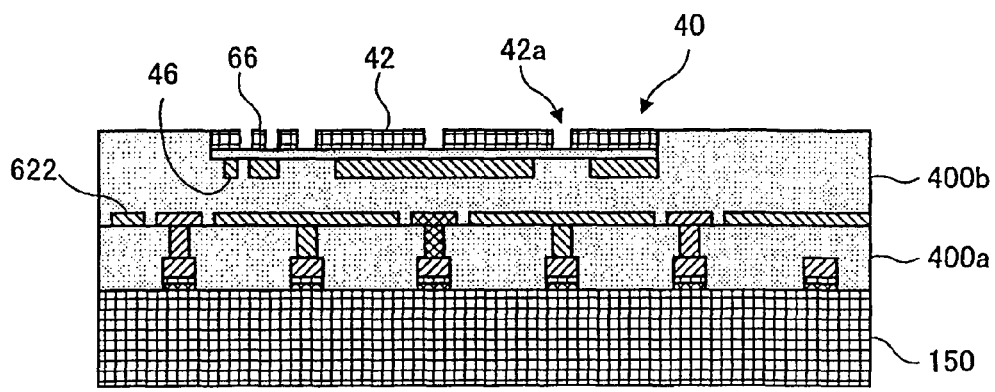
FIG. 19a is a view illustrating a step for manufacturing a printed wiring board according to an embodiment.
FIG. 19b is a view illustrating a step for manufacturing a printed wiring board according to an embodiment.
Figure 19:
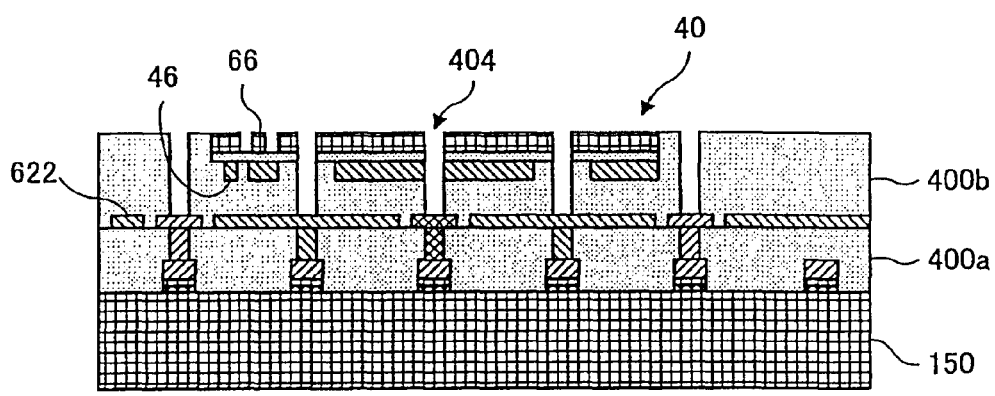
Figure 20:
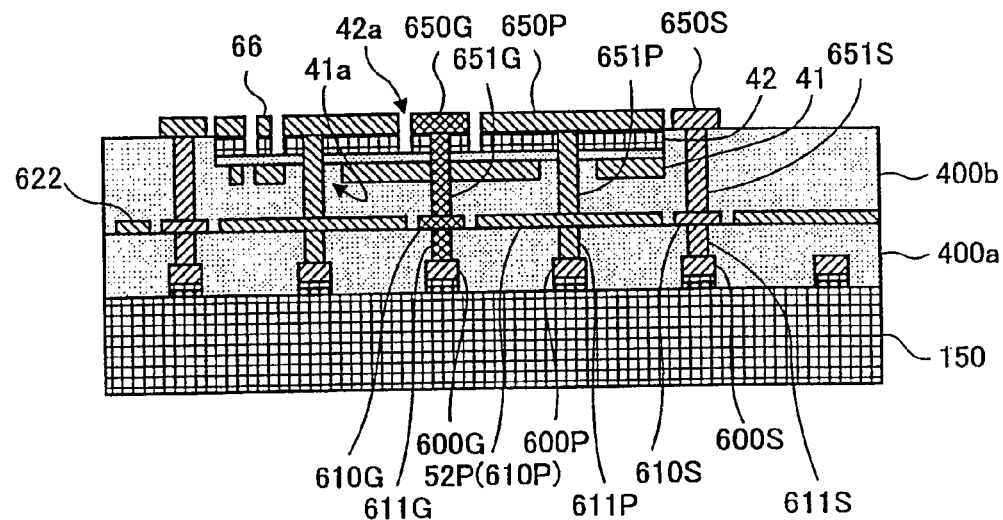
FIG. 20a is a view illustrating a step for manufacturing a printed wiring board according to an embodiment.
FIG. 20b is a view illustrating a step for manufacturing a printed wiring board according to an embodiment.
Figure 20:
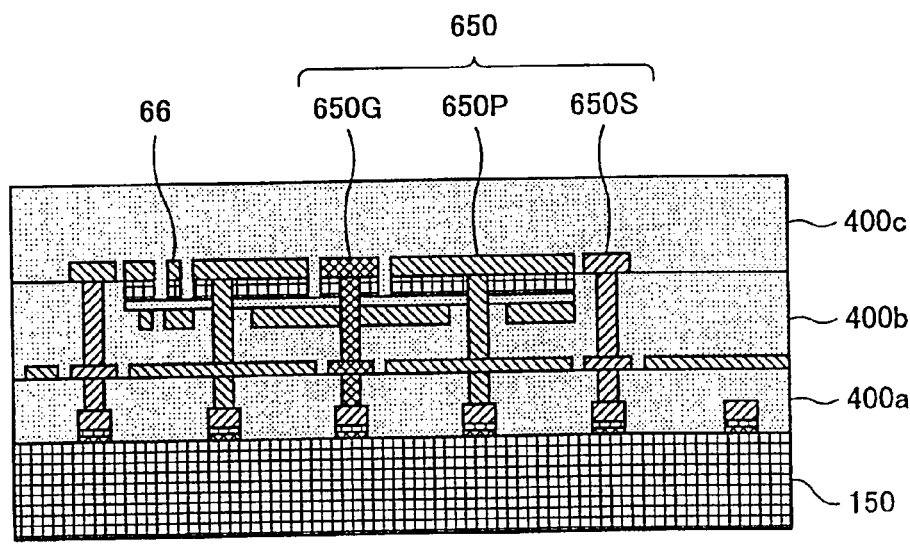
Figure 21:
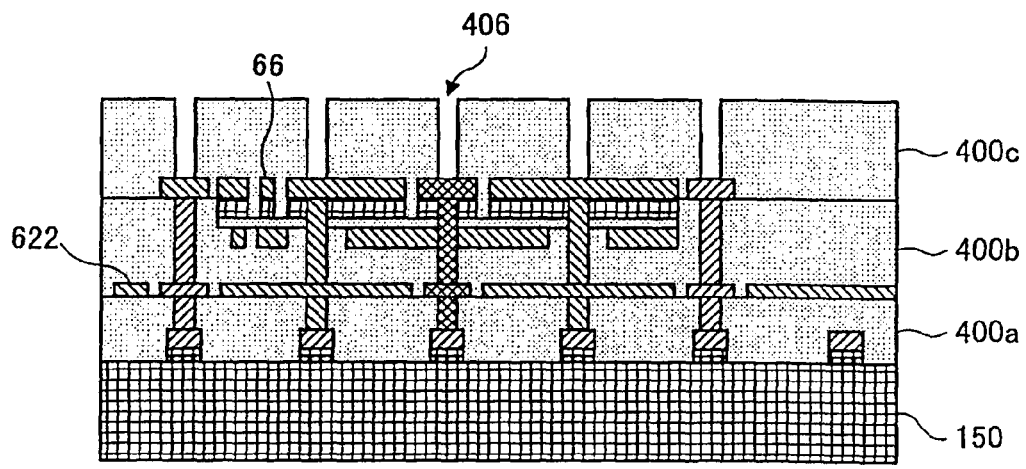
FIG. 21a is a view illustrating a step for manufacturing a printed wiring board according to an embodiment.
FIG. 21b is a view illustrating a step for manufacturing a printed wiring board according to an embodiment.
Figure 21:
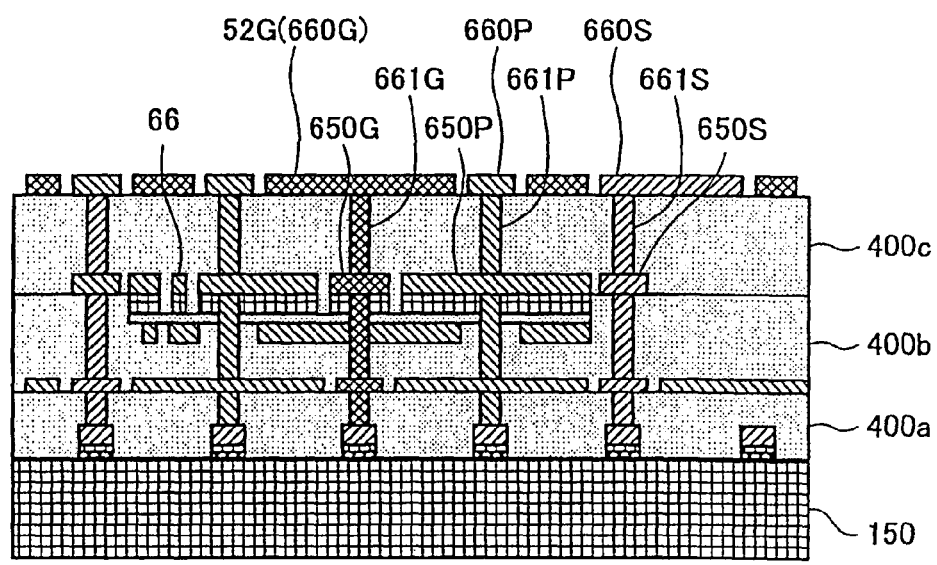
Figure 22:
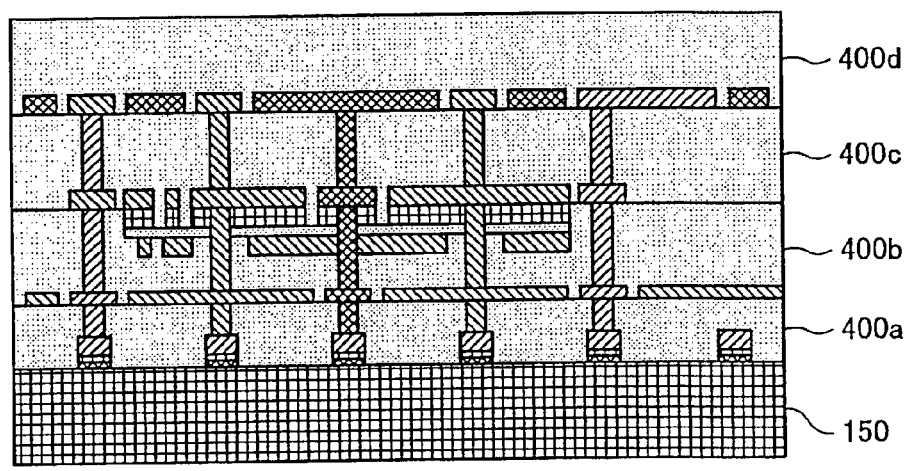
FIG. 22a is a view illustrating a step for manufacturing a printed wiring board according to an embodiment.
FIG. 22b is a view illustrating a step for manufacturing a printed wiring board according to an embodiment.
Figure 22:
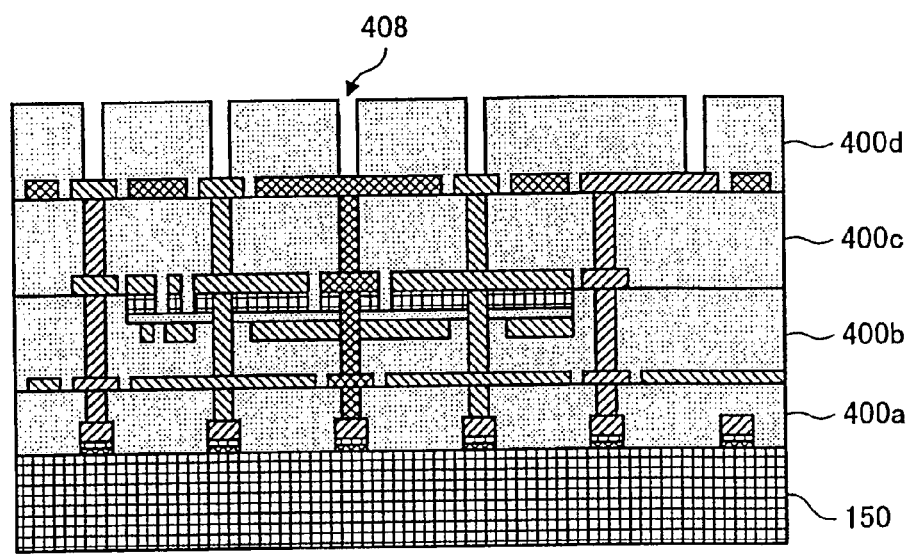
Figure 23:
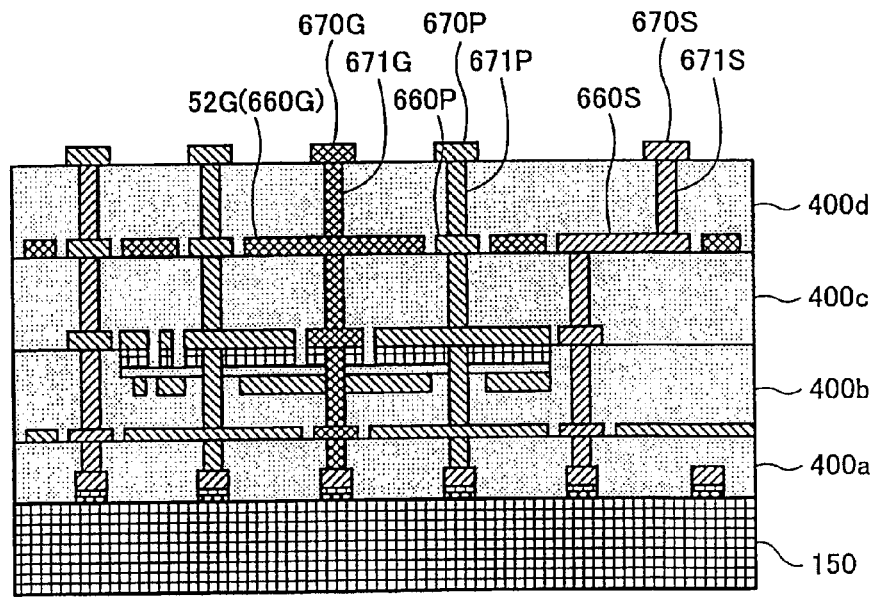
FIG. 23a is a view illustrating a step for manufacturing a printed wiring board according to an embodiment.
FIG. 23b is a view illustrating a step for manufacturing a printed wiring board according to an embodiment.
Figure 23:
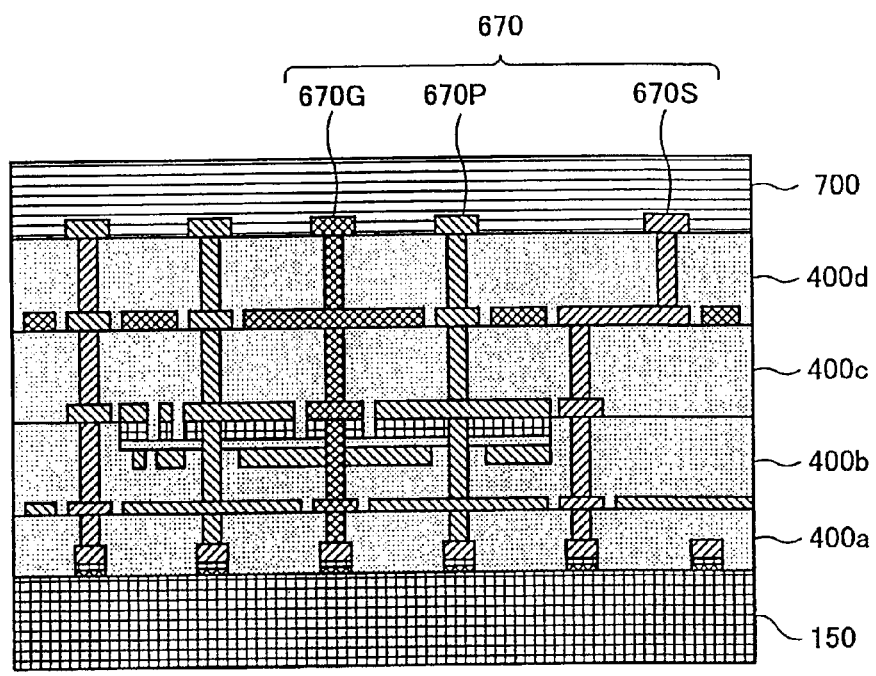
Figure 24:
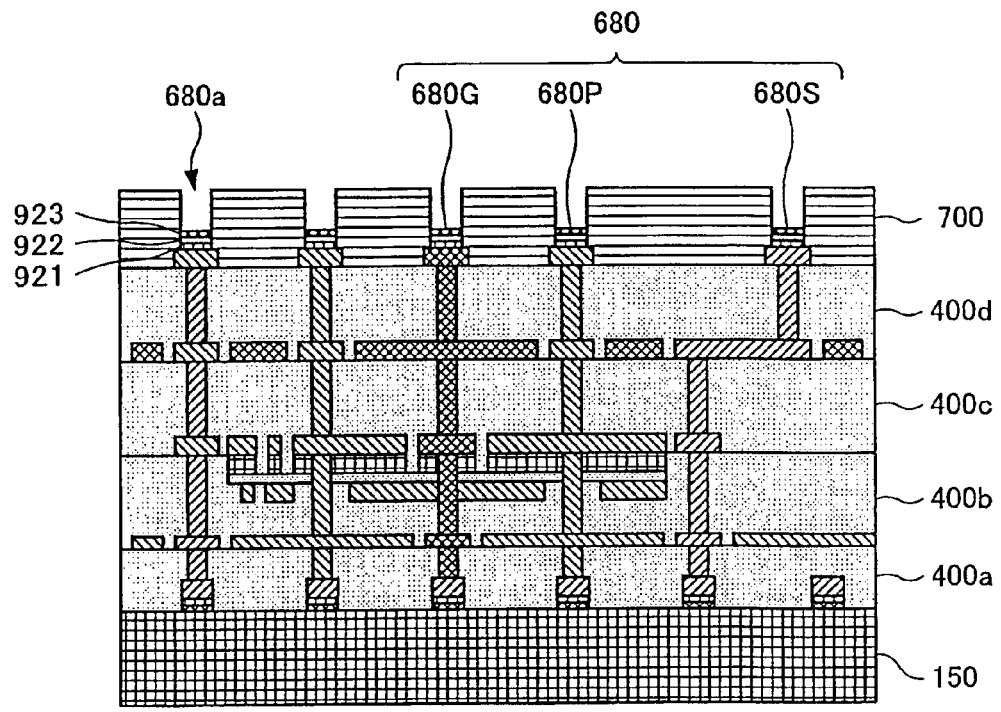
FIG. 24a is a view illustrating a step for manufacturing a printed wiring board according to an embodiment.
FIG. 24b is a view illustrating a step for manufacturing a printed wiring board according to an embodiment.
Figure 24:
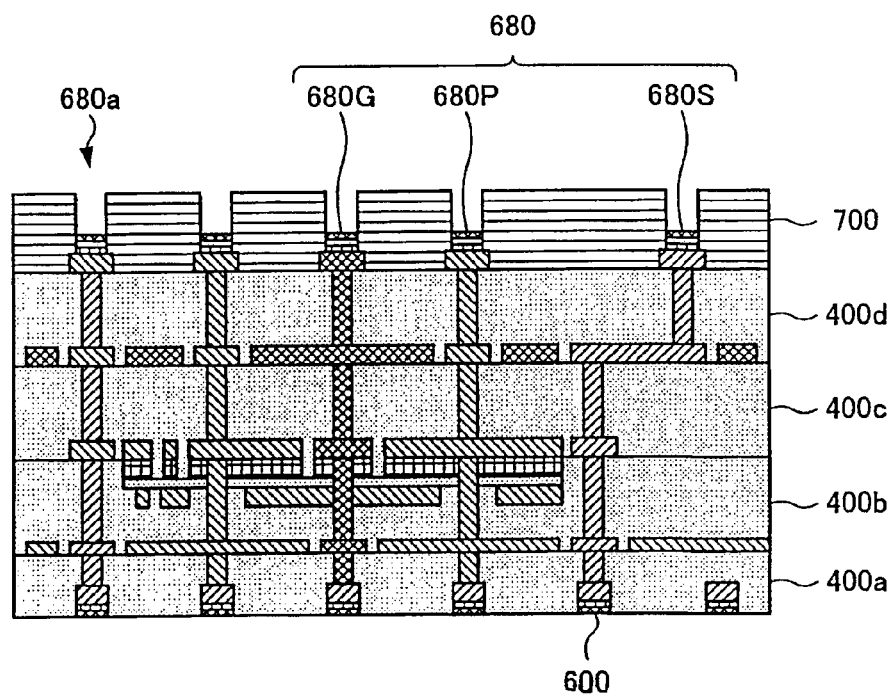

Next, as shown in FIG. 12 (b), through-holes 470 (470S, 470P, 470G) are formed. Through-holes (470S) reach signal wiring (22S) on core substrate 21. Through-holes (470P) reach power-source wiring (22P) on core substrate 21. Through-holes (470G) reach ground wiring (22G) on core substrate 21. Then, on the surface of first interlayer resin insulation layer (36a) in which through-holes 470 are formed, a surface treatment by a catalyst is conducted.

Next, shown in FIG. 13a, by a tenting method, via conductors 414 (signal via conductors (414S), ground via conductors (414G), power-source via conductors (414P)) and wiring patterns 423 (conductive circuit for signals (423S), conductive circuit for power-source (423P), conductive circuit for ground (423G)) are formed. Conductive circuit for power source (423P) is structured with an electroless plated film and an electrolytic plated film on the electroless plated film (not shown in the drawing). Conductive circuit for power source (423P) is formed so as to make contact with second layered electrode 42 of layered capacitor section 40, and fulfills a function as an example of metal thin-film layers.

Ground via conductors (414G) are connected to first layered electrode 41. Also, ground via conductors (414G) connect ground wiring (22G) on core substrate 21 and conductive circuit for ground (423G) on first interlayer resin insulation layer (36a). Power-source via conductors (414P) are connected to second layered electrode 42. Also, power-source via conductors (414P) connect power-source wiring (22P) on core substrate 21 and conductive circuit for power source (423P) on first interlayer resin insulation layer (36a).

Next, as shown in FIG. 13b, second interlayer resin insulation layer (36b) is formed on first interlayer resin insulation layer (36a), layered capacitor section 40 and conductive circuits 423. In FIG. 14a, after through-holes in second interlayer resin insulation layer (36b) are formed, by the tenting method, power-source plane layer (52P) is formed on second interlayer resin insulation layer (36b). At the same time, via conductors 424 (signal via conductors (424S), power-source via conductors (424P), ground via conductors (424G)) which penetrate second interlayer resin insulation layer (36b) are formed. In power-source plane layer (52P), at least one of the following is formed: signal via conductor, signal land, signal wiring (433S), ground via conductor, ground land (433G) or ground wiring.

Then, as shown in FIG. 14b, through the same steps as in the embodiment shown in FIG. 9b and FIG. 10, mounting section 60 structured with ground pads 61, power-source pads 62 and signal pads 63 is formed over interlayer resin insulation layer (36c). Next, after commercially available solder-resist compound is applied, solder-resist layer 58 with opening portions that expose top surfaces of ground pads 61, power-source pads 62 and signal pads 63 is formed. Then, solder bumps are formed on three pads (61, 62, 63) in the opening portions of the solder-resist.

According to the embodiment in FIG. 14b, without forming via conductors that penetrate two interlayer resin insulation layers 36 (first interlayer resin insulation layer (36a) and second interlayer resin insulation layer (36b)), multilayer printed wiring board 300 may be manufactured. Thus, compared with the embodiment in FIG. 1, the number of interlayer resin insulation layers 36 may be reduced by one layer. Also, since second layered electrode 42 of layered capacitor section 40 is structured with second layered electrode 42 along with an electroless plated film on second layered electrode 42 and an electrolytic plated film on the electroless plated film, the strength of built-in layered capacitor 40 increases. As a result, cracks at layered capacitor section 40 seldom occur.

To verify the effect of multilayer printed wiring board 10 according to the embodiment in FIG. 1, multilayer printed wiring board 10 was exposed in an atmosphere of 85° C. and 85% humidity for 100 hours. Then, under the conditions of applied voltage 2V and application time 60 seconds, the insulation resistance of layered capacitor section 40 was measured. The value of insulation resistance was larger than 10 to the power of 10. As an example to compare the effect, a multilayer printed wiring board in which a metal thin-film layer is not formed over the outer side (upper side) of layered capacitor section 40 was manufactured, and under the same measurement conditions as above, the insulation resistance of layered capacitor section 40 was measured. The value of the insulation resistance was 10 to the power of 5.

From the above, it was verified that if a metal thin-film layer is formed over the outer side of layered capacitor section 40, humidity absorption at layered capacitor section 40 is prevented and electric current leakage may be suppressed.

In multilayer printed wiring board 10 according to the embodiment in FIG. 1, layered capacitor section 40 is arranged inside multilayer printed wiring board 10, and on its upper portion (outer side), power-source plane layer (52P) and ground plane layer (52G) are formed as examples of metal thin-film layers. Accordingly, humidity absorption at layered capacitor section 40 is prevented, and electric current leakage may be suppressed. Further, according to the embodiment in FIG. 1, in the same step of forming wiring patterns, first and second alignment marks (26, 46) for aligning positions were formed. Thus, without increasing manufacturing costs, indices for the aligning process were formed. Also, using first and second alignment marks (26, 46), where to form patterns on layered capacitor section 40 or where to arrange each layer is decided. Thus, a proper positional relationship was achieved.

In multilayer printed wiring board 10, relative to ground plane layer (52G), power-source plane layer (52P) is arranged on the lower layer side. However, the present invention is not limited to such. Power-source plane layer (52P) and ground plane layer (52G) may be substituted for each other. From the standpoint of preventing humidity absorption at layered capacitor section 40, it is preferred that on layered capacitor section 40, two or more layers of wiring pattern layers be formed; or it is preferred that from layered capacitor section 40 to the outermost layer be 100 μm or longer.

In the embodiment in FIG. 1, core substrate 21 was a substrate (such as a BT substrate or glass-epoxy substrate) which is made by impregnating core material such as glass cloth or alamide non-woven fabric with thermoset resin or the like and curing it. In contrast, in yet another embodiment, insulation layers of the multilayer printed wiring board do not have a core substrate.

FIGS. 15-25 are views illustrating the steps of manufacturing multilayer printed wiring board 800. First, as shown in FIG. 15a, support board 150 is prepared. Support board 150 is, for example, a copper plate. Here, for the material for support board 150, other than a copper plate, a metal plate such as nickel plate, aluminum plate or iron plate may be used. Next, as shown in FIG. 15b, plating resist 160 is formed on support board 150. Next, as shown in FIG. 15c, through the steps of exposure to light and development, plating resist 160 is patterned and multiple opening portions (160a) are formed in plating resist 160.

Next, as shown in FIG. 16a, in opening portions (160a) (see FIG. 15c) of plating resist 160, electrolytic plating is performed for gold-plated film 911, nickel-plated film 912 and copper-plated film 913 in that order. Accordingly, first external terminals 600 (first external terminals for ground (600G), first external terminals for power source (600P), first external terminals for signals (600S)) and alignment marks 621 are formed. Here, between gold-plated film 911 and nickel-plated film 912, a palladium film may be formed (drawing not shown). Next, as shown in FIG. 16b, plating resist 160 is removed to form first interlayer resin insulation layer (400a). Next, as shown in FIG. 16c, based on alignment mark 621, multiple through-holes 420 which reach first external terminals 600 (600G, 600P, 600S) are formed in first interlayer resin insulation layer (400a).

Next, as shown in FIG. 17a, by the tenting method, at the positions of through-holes 420 (see FIG. 16c) in first interlayer resin insulation layer (400a), first via conductors 611 (first via conductors for ground (611G), first via conductors for power-source (611P), first via conductors for signals (611S)) are formed. At the same time, on the top surface of first interlayer resin insulation layer (400a), power-source plane layer (52P) (first conductive circuit for power source (610P) and first conductive circuit 610 (first conductive circuit for ground (610G), first conductive circuit for signals (610S)) are formed. At that time, first alignment mark 622 is formed simultaneously.

First via conductors for ground (611G) connect external terminals for ground (600G) and first conductive circuit for ground (610G). First via conductors for power source (611P) connect first external terminals for power source (600P) and power-source plane layer (52P). First via conductors for signals (611S) connect first external terminals for signals (600S) and first conductive circuit for signals (610S).

Next, as shown in FIG. 17b, second interlayer resin insulation layer (400b) is formed on power-source plane layer (52P), first conductive circuits 610 (610G, 610S) and first interlayer resin insulation layer (400a). To form second interlayer resin insulation layer (400b), for example, two sheets of "ABF-45SH" made by Ajinomoto Fine-Techno, Co., Inc. may be laminated.

Next, as shown in FIG. 18a, layered capacitor section 40 is laminated by aligning it on second interlayer resin insulation layer (400b). First layered electrode 41 of layered capacitor section 40 is patterned before the lamination; first layered electrode 41 has opening portions (41a) and second alignment marks 46. The position where layered capacitor section 40 is laminated may be decided using, for example, first alignment mark 622 formed on first interlayer resin insulation layer (400a) and second alignment marks 46 of layered capacitor section 40. Layered capacitor section 40 may be formed according to the same manufacturing method as in the first embodiment described with reference to FIG. 5. Next, as shown in FIG. 18b, layered capacitor section 40 is buried in second interlayer resin insulation layer (400b) by vacuum pressing.

Next, as shown in FIG. 19a, second layered electrode 42 is patterned to form opening portions (42a) and third alignment mark 66. Patterning is formed based on first alignment mark 622. Next, as shown in FIG. 19b, based on any one of the three alignment marks 622, 46, or 66, through-holes 404 are formed in second interlayer resin insulation layer (400b).

Next, as shown in FIG. 20a, at the positions of through-holes 404 (see FIG. 19b) formed in second interlayer resin insulation layer (400b), second via conductors 651 (second via conductors for ground (651G), second via conductors for power-source (651P) and second via conductors for signals (651S)) are formed. At the same time, second conductive circuit 650 (second conductive circuit for ground (650G), second conductive circuit for power-source (650P) and second conductive circuit for signals (650S)) are formed. Second conductive circuit for power source (650P) is formed by adhering it to second layered electrode 42, and part of it has the same circuit pattern as second layered electrode 42 ((650P) in FIG. 20a). Second via conductors for power source (651P) are connected to second layered electrode 42 of layered capacitor section 40. Also, second via conductors for power source (651P) penetrate opening portions (41a) without making contact with first layered electrode 41 and are connected to power-source plane layer (52P).

Second via conductors for ground (651G) are connected to second conductive circuit for ground (650G) formed in opening portions (42a) in second layered electrode 42 of layered capacitor section 40. Also, second via conductors for ground (651G) are connected to first layered electrode 41 and connected to first conductive circuit for ground (610G). Second conductive circuit for ground (650G) and second layered electrode 42 remain insulated because of opening portions (42a). Second via conductors for signals (651S) connect second conductive circuit for signals (650S) and first conductive circuit for signals (610S).

Second layered electrode 42 and first external terminals for power source (600P) are electrically connected through first via conductors for power source (611P), power-source plane layer (52P) and second via conductors for power source (651P). Also, first layered electrode 41 and first external terminals for ground (600G) are electrically connected through first via conductors for ground (611G), first conductive circuit for ground (610G) and second via conductors for ground (651G).

Next, as shown in FIG. 20b, between second conductive circuits 650 (650G, 650P, 650S) and second interlayer resin insulation layer (400b), interlayer resin insulation layer (400c) is formed.

Next, as shown in FIG. 21a, based on third alignment mark 66, through-holes 406 are formed in interlayer resin insulation layer (400c). Next, as shown in FIG. 21b, where through-holes 406 (see FIG. 21a) in interlayer resin insulation layer (400c) are positioned, third via conductors 661 (third via conductors for ground (661G), third via conductors for power source (661P), third via conductors for signals (661S)) are formed. At the same time, on interlayer resin insulation layer (400c), ground plane layer (52G) (conductive circuit for ground (660G)) and third conductive circuits 660 (third conductive circuit for power source (660P), third conductive circuit for signals (660S)) are formed.

Third via conductors 661 (third via conductors for power source (661P), third via conductors for signals (661S)) connect second conductive circuits 650 (650P, 650S) and third conductive circuits 660 (660P, 660S) respectively. Also, third via conductors for ground (661G) connect second conductive circuit for ground (650G) and ground plane layer (52G).

Next, as shown in FIG. 22a, interlayer resin insulation layer (400d) is formed on third conductive circuits 660 (660P, 660S), ground plane layer (52G) and interlayer resin insulation layer (400c). Next, as shown in FIG. 22b, through-holes 408 are formed in interlayer resin insulation layer (400d).

Next, as shown in FIG. 23a, at the positions of through-holes 408 (see FIG. 22b) in interlayer resin insulation layer (400d), fourth via conductors for ground (671G), fourth via conductors for power source (671P) and fourth via conductors for signals (671S) are formed. At the same time, on interlayer resin insulation layer (400d), fourth conductive circuits 670 (fourth conductive circuit for ground (670G), fourth conductive circuit for power source (670P), fourth conductive circuit for signals (670S)) are formed.

Fourth via conductors for ground (671G) connect fourth conductive circuit for ground (670G) and ground plane layer (52G). Fourth via conductors for power source (671P) connect third conductive circuit for power source (660P) and fourth conductive circuit for power source (670P). Fourth via conductors for signals (671S) connect third conductive circuit for signals (660S) and fourth conductive circuit for signals (670S). Next, as shown in FIG. 23b, on interlayer resin insulation layer (400d) and fourth conductive circuits 670 (670G, 670P, 670S), solder resist 700 is formed.

Next, as shown in FIG. 24a, multiple opening portions (680a) are bored in solder resist 700. Opening portions (680a) partially open fourth conductive circuits 670 (670G, 670P, 670S) (see FIG. 23b). In opening portions (680a), plating is performed for nickel-plated film 921, palladium-plated film 922 and gold plated-film 923 in that order to form three-layer metal film. The formed metal film will become second external terminals 680 (second external terminals for ground (680G), second external terminals for power source (680P),
second external terminals for signals (680S)). Here, the metal film may be one layer with a gold-plated film, or two layers with a nickel-plated film and a gold-plated film on the nickel-plated film.

Next, as shown in FIG. 24b, support board 150 is removed by etching using a copper (II) chloride etching solution. Here, second external terminals 680 (680G, 680P, 680S) and first external terminals 600 (600G, 600P, 600S) are structured with an outermost layer made of a metal film (gold-plated film) tolerant to etching solutions. Therefore, two external terminals (680, 600) are not removed by etching, but only support board 150 may be removed. After that, on second external terminals 680 (680G, 680P, 680S), second solder bumps are formed, and on first external terminals 600 (600G, 600P, 600S), first solder bumps are formed. Accordingly, the embodiment of the multilayer printed wiring board as shown in FIG. 25 is obtained.

Further, through first solder bumps, electronic components such as an IC chip may be loaded. Through second solder bumps, another substrate (mother board) may be connected. In addition, in FIG. 25, solder bumps are formed on both first external terminals 600 and second external terminals 680. However, solder bumps may be formed on second external terminals 680, and conductive pins may be loaded (mounted) via solder on first external terminals 600 (not shown in the drawing); solder bumps may be formed on first external terminals 600, and conductive pins may be loaded (mounted) via solder on second external terminals 680 (not shown in the drawing). An IC chip may be loaded either on the top surface or the bottom surface of multilayer printed wiring board 800. However, an IC chip is preferred to be loaded on the surface of a substrate with a built-in capacitor whose distance (the distance in the cross-sectional direction of the substrate) from external terminals to the capacitor is shorter.

Figure 25:
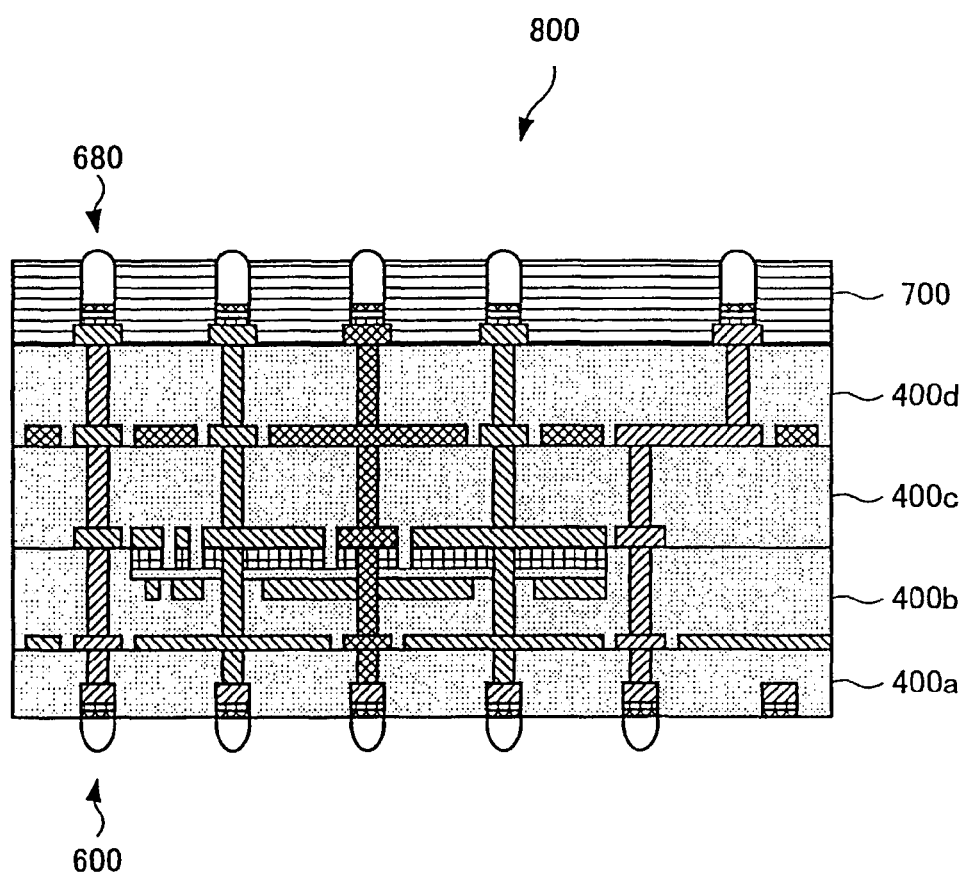
FIG. 25 is a view illustrating a longitudinal section of a printed wiring board according to an embodiment.

In the embodiment shown in FIG. 25, interlayer resin insulation layers (resin films) are structured with three layers, (400b)-(400d). However, by repeating the steps shown in FIG. 20b-FIG. 21b, a multilayer structure with four layers or more may be obtained. Since multilayer printed wiring board 800 according to the embodiment in FIG. 25 does not have a core substrate, it may be formed thinner than multilayer printed wiring board 10 according to the embodiment in FIG. 1. As a result, the distance from an outer power source to layered capacitor section 40, or the distance from layered capacitor section 40 to the mounting section may be made shorter. Further, since layered capacitor section 40 is sandwiched by two plane layers (52P, 52G), the insulation at layered capacitor section 40 may seldom degrade.

What is claimed:

1. A multilayer printed wiring board, comprising: a layered capacitor section having a high dielectric layer and first and second layered electrodes sandwiching the high dielectric layer, where either the first or the second layered electrode is connected to a power-source line and the other layered electrode, which is not connected to the power-source line, is connected to a ground line to store a predetermined amount of electric charge; a metal thin-film layer provided over the layered capacitor section on an interlayer resin insulation layer, wherein the metal thin film layer is a power-source plane layer which maintains the same electrical potential as the layered electrode which is connected to the power-source line and is a continuous metal layer over the layered capacitor section except for ground lands; and a mounting section, provided over the metal thin-film layer on the interlayer resin insulation layer and configured to mount on a surface of the mounting section a semiconductor element electrically connected to the layered capacitor section through via holes.

2. The multilayer printed wiring board of claim 1, further comprising another metal thin-film layer provided over the layered capacitor section on another interlayer resin insulation layer, wherein the another metal thin film layer is a ground plane layer which maintains the same electrical potential as the layered electrode which is connected to the ground line.

* * * * *